(12) United States Patent
Lang et al.

(10) Patent No.: US 8,286,332 B2
(45) Date of Patent: Oct. 16, 2012

(54) METHOD AND APPARATUS FOR MAKING A RADIO FREQUENCY INLAY

(75) Inventors: Ulrich Lang, Marktoberdorf (DE);
Lionel Carre, Seeg (FR);
Viroel-Marian Hasegan, Fussen (DE);
David Finn, Tourmakeready (IE)

(73) Assignee: HID Global GmbH, Walluf (DE)

( * ) Notice: Subject to any disclaimer, the term of this patent is extended or adjusted under 35 U.S.C. 154(b) by 982 days.

(21) Appl. No.: 11/860,210

(22) Filed: Sep. 24, 2007
(Under 37 CFR 1.47)

(65) Prior Publication Data
US 2008/0150817 A1 Jun. 26, 2008

Related U.S. Application Data

(63) Continuation of application No. 11/733,756, filed on Apr. 10, 2007.

(60) Provisional application No. 60/826,923, filed on Sep. 26, 2006, provisional application No. 60/829,862, filed on Oct. 17, 2006, provisional application No. 60/913,753, filed on Apr. 24, 2007.

(51) Int. Cl.
*H01Q 17/00* (2006.01)
(52) U.S. Cl. .......................................... 29/601; 29/854
(58) Field of Classification Search ............... 29/854, 29/601
See application file for complete search history.

(56) References Cited

U.S. PATENT DOCUMENTS

| 3,116,889 A | 1/1964 | Lasch, Jr. et al. |
| 3,384,283 A | 5/1968 | Mims |
| 3,674,602 A | 7/1972 | Keogh et al. |
| 3,674,914 A | 7/1972 | Burr |
| 3,917,148 A | 11/1975 | Runyon |
| 4,437,603 A | 3/1984 | Kobayashi et al. |
| 4,450,623 A | 5/1984 | Burr |
| 4,641,773 A | 2/1987 | Morino et al. |
| 4,642,321 A | 2/1987 | Schoenberg et al. |

(Continued)

FOREIGN PATENT DOCUMENTS
AU 720773 6/2000
(Continued)

OTHER PUBLICATIONS

Official Action for European Patent Application No. 07872847.4, dated Oct. 29, 2010.

(Continued)

*Primary Examiner* — Livius R Cazan
*Assistant Examiner* — Jeffrey T Carley
(74) *Attorney, Agent, or Firm* — Sheridan Ross P.C.

(57) ABSTRACT

A method and apparatus are provided for making radio frequency (RF) inlays. The RF inlays include an integrated circuit and an antenna affixed to a substrate material carrying the integrated circuit. During processing, portions of the wire forming the antenna are located adjacent to, but not directly over the integrated circuit such that the wire may be subject to further processing, such as removing insulation without potentially damaging the integrated circuit. In the subsequent processing step, the wire ends are placed in contact with and secured to the integrated circuit terminal areas. Methods of the invention include forming loops with the wire ends wherein the loops extend above a plane of the substrate, and in another processing step, the loops are displaced to be electrically connected to the terminal areas. Methods also include repositioning the wire and using a brush or comb device.

33 Claims, 15 Drawing Sheets

U.S. PATENT DOCUMENTS

| | | | |
|---|---|---|---|
| 4,693,778 A | 9/1987 | Swiggett et al. | |
| 4,711,026 A | 12/1987 | Swiggett et al. | |
| 4,791,285 A | 12/1988 | Ohki | |
| 4,861,533 A | 8/1989 | Bertin et al. | |
| 4,912,143 A | 3/1990 | Ahn et al. | |
| 5,008,619 A | 4/1991 | Keogh et al. | |
| 5,041,826 A | 8/1991 | Milheiser | |
| 5,094,907 A | 3/1992 | Yamamura et al. | |
| 5,186,776 A | 2/1993 | Boyce et al. | |
| 5,201,453 A | 4/1993 | Amador et al. | |
| 5,281,855 A | 1/1994 | Hadden et al. | |
| 5,288,008 A | 2/1994 | Haji et al. | |
| 5,294,290 A | 3/1994 | Reeb | |
| 5,365,657 A | 11/1994 | Brown et al. | |
| 5,377,894 A | 1/1995 | Mizoguchi et al. | |
| 5,393,001 A | 2/1995 | Gustafson | |
| 5,531,390 A | 7/1996 | Gustafson | |
| 5,535,043 A | 7/1996 | La Fiandra et al. | |
| 5,606,488 A | 2/1997 | Gustafson | |
| 5,649,352 A | 7/1997 | Gustafson | |
| 5,770,807 A | 6/1998 | Finn et al. | |
| 5,773,812 A | 6/1998 | Kreft | |
| 5,809,633 A | 9/1998 | Mundigl et al. | |
| 6,008,993 A | 12/1999 | Kreft | |
| 6,023,837 A | 2/2000 | Finn | |
| 6,055,720 A | 5/2000 | Finn et al. | |
| 6,067,235 A | 5/2000 | Finn et al. | |
| 6,088,230 A * | 7/2000 | Finn et al. | 361/737 |
| 6,095,423 A | 8/2000 | Houdeau et al. | |
| 6,102,275 A | 8/2000 | Hill et al. | |
| 6,142,381 A * | 11/2000 | Finn et al. | 235/492 |
| 6,152,348 A | 11/2000 | Finn et al. | |
| 6,173,879 B1 | 1/2001 | Chiba | |
| 6,190,942 B1 | 2/2001 | Wilm et al. | |
| 6,233,818 B1 | 5/2001 | Finn et al. | |
| 6,288,443 B1 | 9/2001 | Finn et al. | |
| 6,295,720 B1 | 10/2001 | Finn et al. | |
| 6,310,778 B1 | 10/2001 | Finn et al. | |
| 6,313,566 B1 | 11/2001 | Cunningham et al. | |
| 6,351,525 B1 | 2/2002 | Rodriguez | |
| 6,471,878 B1 | 10/2002 | Greene et al. | |
| 6,491,202 B1 | 12/2002 | Kyomasu et al. | |
| 6,521,829 B2 | 2/2003 | Matsumura et al. | |
| 6,604,686 B1 * | 8/2003 | Taban | 235/492 |
| 6,619,530 B2 | 9/2003 | Ushiki et al. | |
| 6,626,364 B2 | 9/2003 | Taban | |
| 6,628,240 B2 | 9/2003 | Amadeo | |
| 6,662,430 B2 | 12/2003 | Brady et al. | |
| 6,698,089 B2 | 3/2004 | Finn et al. | |
| 6,779,348 B2 | 8/2004 | Taban | |
| 6,810,580 B2 * | 11/2004 | Yamaguchi et al. | 29/748 |
| 6,870,497 B2 | 3/2005 | Kondo et al. | |
| 6,897,090 B2 | 5/2005 | DiStefano et al. | |
| 7,032,311 B2 | 4/2006 | Razon | |
| 7,059,535 B2 | 6/2006 | Rietzler | |
| 7,105,915 B1 | 9/2006 | Finn et al. | |
| 7,229,022 B2 | 6/2007 | Rietzler | |
| 2001/0054230 A1 * | 12/2001 | Finn et al. | 29/748 |
| 2002/0020903 A1 | 2/2002 | Kreft et al. | |
| 2002/0060239 A1 | 5/2002 | Or et al. | |
| 2003/0000070 A1 | 1/2003 | Lee et al. | |
| 2003/0024103 A1 * | 2/2003 | Kiguchi et al. | 29/601 |
| 2004/0155114 A1 * | 8/2004 | Rietzler | 235/492 |
| 2004/0206799 A1 | 10/2004 | Wong | |
| 2006/0071084 A1 * | 4/2006 | Detig et al. | 235/492 |
| 2006/0208066 A1 | 9/2006 | Finn et al. | |
| 2009/0033585 A1 | 2/2009 | Lang | |
| 2009/0100667 A1 | 4/2009 | O'Keeffe | |
| 2010/0141453 A1 | 6/2010 | Finn et al. | |

FOREIGN PATENT DOCUMENTS

| | | |
|---|---|---|
| CA | 2348461 | 5/2000 |
| CA | 2555034 | 9/2005 |
| CN | 1210602 | 3/1999 |
| DE | 2111396 | 9/1971 |
| DE | 3247344 | 7/1983 |
| DE | 3622246 | 1/1987 |
| DE | 3624630 | 2/1987 |
| DE | 3805584 | 8/1989 |
| DE | 3937988 | 5/1990 |
| DE | 4205084 | 9/1993 |
| DE | 4325334 | 12/1994 |
| DE | 4329708 | 3/1995 |
| DE | 4332055 | 3/1995 |
| DE | 4408124 | 9/1995 |
| DE | 4410732 | 10/1995 |
| DE | 4417625 | 11/1995 |
| DE | 4431605 | 3/1996 |
| DE | 4446289 | 6/1996 |
| DE | 19509999 | 9/1996 |
| DE | 19525933 | 1/1997 |
| DE | 19534480 | 3/1997 |
| DE | 19604840 | 3/1997 |
| DE | 19541039 | 5/1997 |
| DE | 19541996 | 5/1997 |
| DE | 19619771 | 8/1997 |
| DE | 19610507 | 9/1997 |
| DE | 19616424 | 10/1997 |
| DE | 19654902 | 10/1997 |
| DE | 19620242 | 11/1997 |
| DE | 19713634 | 11/1997 |
| DE | 19634473 | 1/1998 |
| DE | 19634661 | 3/1998 |
| DE | 19646717 | 5/1998 |
| DE | 19651566 | 6/1998 |
| DE | 59503553 | 10/1998 |
| DE | 19716912 | 11/1998 |
| DE | 19741984 | 6/1999 |
| DE | 19751043 | 6/1999 |
| DE | 59602458 | 8/1999 |
| DE | 59602495 | 8/1999 |
| DE | 19822383 | 12/1999 |
| DE | 59507294 | 12/1999 |
| DE | 19850353 | 3/2000 |
| DE | 19840220 | 4/2000 |
| DE | 59701709 | 6/2000 |
| DE | 19903784 | 8/2000 |
| DE | 19920593 | 11/2000 |
| DE | 59508993 | 3/2001 |
| DE | 19946254 | 4/2001 |
| DE | 19934789 | 5/2001 |
| DE | 10009456 | 9/2001 |
| DE | 59607684 | 10/2001 |
| DE | 59707230 | 6/2002 |
| DE | 59610675 | 9/2003 |
| DE | 59711861 | 9/2004 |
| DE | 102004010013 | 9/2004 |
| DE | 102004011929 | 9/2005 |
| DE | 202005016382 | 2/2006 |
| DE | 102004043747 | 3/2006 |
| DE | 102004045896 | 3/2006 |
| EP | 0133820 | 3/1985 |
| EP | 0212238 | 3/1987 |
| EP | 0217019 | 4/1987 |
| EP | 0227002 | 7/1987 |
| EP | 0276928 | 8/1988 |
| EP | 0481776 | 4/1992 |
| EP | 0593966 | 4/1994 |
| EP | 0692770 | 1/1996 |
| EP | 0753180 | 1/1997 |
| EP | 0759830 | 3/1997 |
| EP | 0804799 | 11/1997 |
| EP | 0815475 | 1/1998 |
| EP | 0839360 | 5/1998 |
| EP | 0852040 | 7/1998 |
| EP | 0859681 | 8/1998 |
| EP | 0880754 | 12/1998 |
| EP | 0922289 | 6/1999 |
| EP | 0944922 | 9/1999 |
| EP | 0976099 | 2/2000 |
| EP | 1125248 | 8/2001 |
| EP | 1177579 | 2/2002 |
| GB | 1352557 | 5/1974 |
| GB | 1593235 | 7/1981 |
| GB | 2180175 | 3/1987 |
| GB | 2180408 | 3/1987 |

| | | |
|---|---|---|
| JP | 062008313 | 1/1987 |
| JP | 1264234 | 10/1989 |
| JP | 06351194 | 12/1994 |
| JP | 9507727 | 8/1997 |
| JP | 9510834 | 10/1997 |
| JP | 11502334 | 2/1999 |
| JP | 11-328346 | 11/1999 |
| JP | 11514933 | 12/1999 |
| JP | 11515120 | 12/1999 |
| JP | 2000-502477 | 2/2000 |
| WO | WO 91/16718 | 10/1991 |
| WO | WO 93/20537 | 10/1993 |
| WO | WO 94/28562 | 12/1994 |
| WO | WO 95/03685 | 2/1995 |
| WO | WO 95/26538 | 10/1995 |
| WO | WO 95/32073 | 11/1995 |
| WO | WO 96/07984 | 3/1996 |
| WO | WO 96/13793 | 5/1996 |
| WO | WO 96/22608 | 7/1996 |
| WO | WO 96/29618 | 9/1996 |
| WO | WO 97/04415 | 2/1997 |
| WO | WO 97/11437 | 3/1997 |
| WO | WO 97/17191 | 5/1997 |
| WO | WO 97/30418 | 8/1997 |
| WO | WO 97/35273 | 9/1997 |
| WO | WO 98/02848 | 1/1998 |
| WO | WO 98/09305 | 3/1998 |
| WO | WO 98/26453 | 6/1998 |
| WO | WO 00/26855 | 5/2000 |
| WO | WO 00/68994 | 11/2000 |
| WO | WO 01/08089 | 2/2001 |
| WO | WO 02/46896 | 6/2002 |
| WO | WO 02/077918 | 10/2002 |
| WO | WO 2004/006178 | 1/2004 |

OTHER PUBLICATIONS

AIT, Coil Manufacturing Technology, Sep. 1995, 6 pages.
AIT, CoilPro Wiring Systems, CoilPro 2000, date unknown, 1 page.
AIT, Embedded Wire Technology, date unknown, 1 page.
AIT, RFID Embedded Wire Technology, date unknown, 1 page.
European Search Report and Written Opinion, Reference No. E87054 EP (GS/, Application No. 07018301.7, Aug. 2, 2008; 6 pgs.
International Search Report for International (PCT) Patent Application No. PCT/IB2007/004589, mailed Nov. 28, 2008.
Written Opinion for International (PCT) Patent Application No. PCT/IB2007/004589, mailed Nov. 28, 2008.
International Preliminary Report on Patentability for International (PCT) Patent Application No. PCT/IB2007/004589, mailed Apr. 9, 2009.
Official Action for Australia Patent Application No. 2007349611, dated Jul. 25, 2011 2 pages.
English translation of Official Action for China Patent Application No. 200780040534.5, issued Jul. 26, 2011 3 pages.
English Translation of Official Action for China Patent Application No. 200780041337.5, dated Aug. 31, 2011 3 pages.
English Translation of Official Action for Japan Patent Application No. 2009-529801, drafted Sep. 9, 2011 3 pages.
Official Action for European Patent Application No. 07872847.4, dated Sep. 15, 2011 4 pages.
International Seach Report for International (PCT) Application No. PCT/IB2007/004658, mailed Mar. 4, 2009.
Written Opinion for International (PCT) Application No. PCT/IB2007/004658, mailed Mar. 4, 2009.
International Preliminary Report on Patentability for International (PCT) Application No. PCT/IB2007/004658, mailed Apr, 9, 2009.
Official Action for European Patent Application No. 07875200.3, dated Nov. 2, 2009.
Official Action for European Patent Application No. 07875200.3, dated Oct. 29, 2010.
Official Action (Restriction Requirement) for U.S. Appl. No. 11/860,162, mailed Jun. 4, 2010.
Official Action for U.S. Appl. No. 11/860,210, mailed Sep. 23, 2010.
Notice of Allowance for U.S. Appl. No. 11/860,210, mailed Mar. 3, 2011.
Official Action for European Patent Application No. 07875200.3, dated May 16, 2011.
Examiner's Answer to Appeal Brief for U.S. Appl. No. 11/718,512, mailed Oct. 17, 2011 11 pages.
Communication of a Notice of Opposition for European Patent Application No. 07820048.2, dated Oct. 17, 2011, 22 pages.
Communication of Notices of Opposition (R. 79(1) EPC) for European Patent Application No. 07820048.2, dated Nov. 24, 2011, 1 page.
Notice of Acceptance for Australia Patent Application No. 2007349611, dated Jan. 25, 2012 3 pages.
Official Action with English Translation for China Patent Application No. 200780040534.5, dated May 2, 2012 8 pages.
Official Action for U.S. Appl. No. 12/212,882, mailed May 17, 2012 8 pages.
Official Action with English translation for China Patent Application No. 200780041337.5, dated May 2, 2012 13 pages.

* cited by examiner

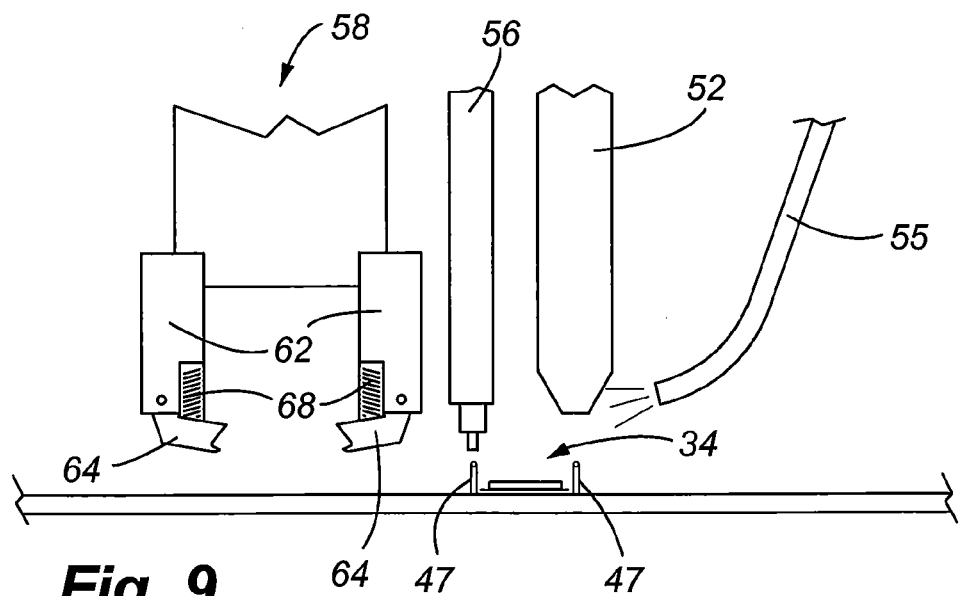
Fig. 9
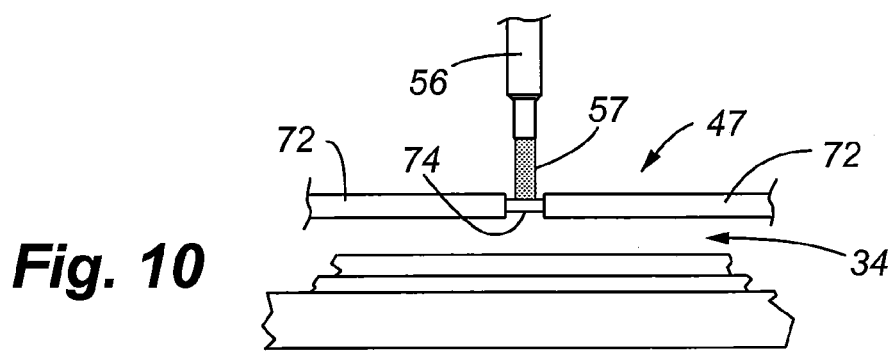
Fig. 10
Fig. 11
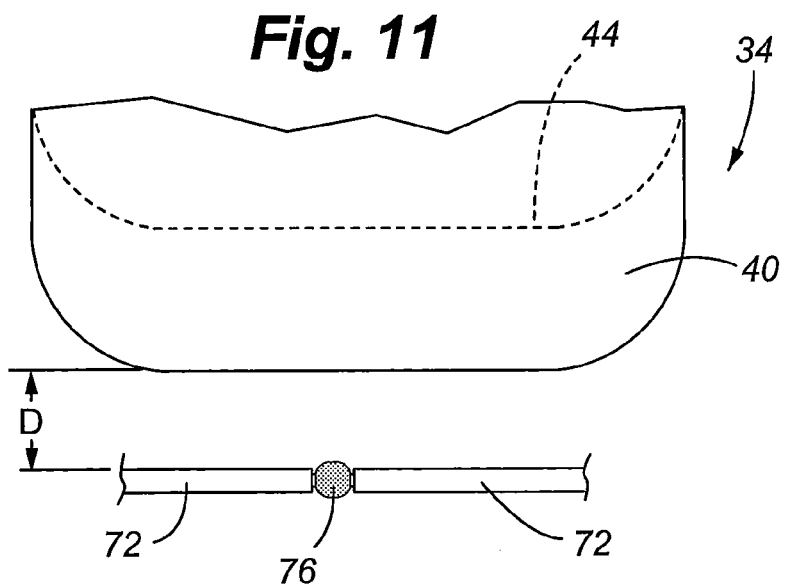

METHOD AND APPARATUS FOR MAKING A RADIO FREQUENCY INLAY

CROSS-REFERENCE TO RELATED APPLICATIONS

The present application claims the benefit, under 35 U.S.C. §119(e), of U.S. Provisional Application Ser. Nos. 60/826,923 filed Sep. 26, 2006; 60/829,862 filed Oct. 17, 2006; and 60/913,753 filed Apr. 24, 2007; and claims the benefit, under 35 U.S.C. §120, of U.S. application Ser. No. 11/733,756 filed Apr. 10, 2007.

FIELD OF THE INVENTION

The present invention relates to a method and apparatus for making radio frequency (RF) inlays and the resulting inlay, and more particularly to a method and apparatus for making high frequency RF devices that include an integrated circuit and an antenna affixed to a substrate material.

BACKGROUND OF THE INVENTION

An RF inlay is generally understood to be an integrated circuit and antenna joined together on some type of substrate. Typically, the inlay is subjected to further processing to make a final product. Further processing may include adding additional outer layers of material such as plastic to make a card-shaped device. Other finishing techniques may form the inlay into a variety of final forms depending upon the final application of the product.

In general terms, the integrated circuit is inductively coupled to one or more interrogating devices or readers through the antenna by means of radio frequency communication. The integrated circuit or chip contains information that is useful for performing various tasks. One type of information is identification information pertaining to the holder or user of the RF device. In this case, the RF device may also be referred to as a radio frequency identification (RFID) device. Not all RF devices necessarily contain information about the identity of the user and some RF devices contain information in addition to the identity of the user.

RF inlays in their finished form are used in a variety of applications. For example, RF inlays are used for making security access devices (RFID devices) or may be used for other applications that may or may not involve identification of the user, including but not limited to access to computer or computer networks and databases, public transportation passes, toll way access passes, vending machine payment devices, and bank debit and/or credit cards and passports. Given the variety and expanding end user applications for RF devices, they are also sometimes referred to as "smart cards." Some identification applications, such as passports, now utilize RFID inlays or RFID prelams (transponders that have been subjected to a lamination process) to store identification data and to allow efficient and rapid transfer of the identification data for processing by appropriate governmental agencies. The identification data may include biometric data, such as fingerprints, and/or photos of the passport holder, as well as information identifying the holder.

A variety of methods exist for manufacturing RF inlays. In some methods a substrate of one or more layers is processed in various steps including hot and/or cold lamination. A chip and antenna subassembly is incorporated in one or more of the layers and the layers are joined together by adhesives or by softening the plastic layer and, by means of pressure, joining the layers together. In other methods, wire is affixed to or embedded within a substrate in the form of an antenna and the opposing ends of the antenna coil are attached to the terminals of an integrated circuit (IC or chip) or to the terminal areas of a chip module. A chip module as that term is used herein comprises an integrated circuit attached to a lead frame having enlarged terminal areas. The terminal areas of the chip are connected to the enlarged terminal areas of the lead frame by either extremely small and delicate wires, on the order of 20 to 28 microns in diameter, or through a conductive adhesive such as in the case of a flip chip. The chip and the electrical connections to the terminal areas of the lead frame are encased in an epoxy layer for protection. The combination or subassembly of the chip/chip module and the coil of wire that forms an antenna is sometimes referred to as a transponder. The wire forming the antenna may be embedded fully or partially within the substrate by use of an ultrasonic wire embedding technique, as understood by those skilled in the art. The chip/chip module may be secured to the substrate by either placing it on the surface of the substrate or by placing it in a recess formed in the substrate. Adhesive may or may not be used to adhere the chip/chip module to the substrate. The ends of the coil of wire may be bonded or connected to the terminal areas of the chip or chip module at about the same time as the wire is embedded in the substrate, or the bonding may be done in a separate or subsequent manufacturing step.

Nominally, the wire used in the manufacture of RF inlays, where the wire is ultrasonically embedded in a substrate, is 110 to 120 microns in diameter, which includes an outer insulating layer. The wire is insulated to prevent short-circuiting of the antenna, as the windings of wire forming the antenna are closely positioned and may touch. The insulation layer is typically made from polyurethanes, polyvinylbutyrals, polyamides, polyesterimides and similar compounds. Thicker or larger diameter wires, compared to thinner or smaller diameter wires, are more easily handled and typically provide a farther read range when inductively coupled to a reader. Larger diameter wires are also more robust and are susceptible to removal from an RF device without damage to their integrity or the operation and functionality of the transponder. Potential removal and reuse of a transponder raises a number of security and privacy problems. For example, if a legitimate transponder subassembly (chip/chip module and antenna) may be removed from one passport and placed in another fraudulent passport, substantial security issues are raised.

There are a number of patents that disclose various devices and methods for the manufacture of RF devices including the manufacture of inlays. For example, U.S. Pat. Nos. 6,698,089 and 6,233,818 disclose methods of making an RF device wherein at least one chip and one antenna are affixed to a chip mounting board or substrate. The wire forming the antenna is embedded in the substrate by use of an ultrasonic generator. As part of the wire embedding process disclosed in each of these patents, the insulated antenna wire is first fixed to the substrate. The insulated wire is then guided directly over and away from a terminal area of the RFID chip and embedded to the substrate on the opposite side of the chip from the first embedding location to linearly align the wire between the two fixed locations and directly across the terminal area. Next, the antenna is formed by embedding the insulated wire into the substrate at a location spaced from the chip and terminal areas, the antenna being formed with a specific number of turns of the wire. The antenna wire is then guided over another terminal area of the RFID chip and finally embedded on the opposite side to anchor the second end of the wire directly across the other terminal area of the chip. The wire is then cut and the embedding head (or embedding tool) moves to a second transponder site on the substrate to repeat the same process. In the next stage of production, the wire portions passing directly over the terminal areas of the RFID chip are interconnected to the terminal areas by means of thermal compression bonding. Alternatively, the wire may be embedded as described and the chip subsequently positioned in a pre-designated recess where the terminals of the chip will contact the previously secured wire. The ends of the wire then will be bonded to the terminal areas of the chip by means of thermal compression bonding. U.S. Pat. No. 6,088,230 describes an alternative process where a first end of the wire is positioned in contact with a first terminal area of a chip or chip module and is bonded to the first terminal area, then the embedding tool embeds the wire in the substrate to form an antenna, and then the wire is positioned over a second terminal area of the chip or chip module where it is bonded to the terminal area.

While the inventions disclosed in these references may be adequate for the intended purposes, there is still a need for an improved method of making RF inlays for various applications including but not limited to contactless smart cards and other security access devices.

With respect to improved security for information stored on an integrated circuit incorporated within a transponder, it is desirable to improve fraud prevention. For example, with electronic passport devices it is desirable to inhibit the removal of a transponder from a valid passport such that the removed transponder cannot be used in a second fraudulent passport. In this regard, the present invention may utilize small diameter wire, for example 60-micron wire diameter or less. By using thinner wire, the ability to successfully remove a chip and antenna assembly from an existing product, such as a passport, is substantially reduced as the antenna and/or its connection to the chip or chip module will likely be destroyed upon any attempted removal. However, utilizing thinner wire also places a greater significance on the bond between the wire and chip terminals. When using thinner wire, flaws or defects in the bonding process can lead to weak and/or faulty bonds.

There is also a need to provide RF and RFID devices that have increased life and durability. One factor that limits the useful life of such devices is the quality of the electrical connection between the antenna wire and the chip. Improving the structural stability of the electrical connection or bond will necessarily extend the life of the transponder.

In this regard, another problem is that undesirable oxidation may occur over time due to impurities at the bond site. For example, insulation material on the wire or by-products of the insulation material created as part of the process of bonding insulated wire to the chip or lead frame terminal areas can form impurities at the bond site. More specifically, and as previously noted, the wire that is used to form the antenna often includes an outer insulation or coating. During a typical manufacturing process, the antenna wire is bonded to the terminal area or bond pad by a high-energy thermal compression bonding technique. The technique involves the application of a high voltage arc through a thermal bonding head that causes removal of the insulation, and simultaneously creates a localized weld that electrically connects the wire to the designated terminal. If all of the insulation is not removed from the wire the remaining insulation may reduce the quality of the electrical bond and, therefore, the quality of the electrical connection. Additionally, by-products of the insulation material formed from the high temperature bonding process may be captured within the bond and may cause oxidation or deteriorization of the bond over time. Current wire embedding techniques do not allow for precise localized removal of the insulation due to the potential of damaging the chip or chip module in the process resulting from the close proximity of the embedded wire and terminal areas. Indeed, as noted previously, prior art techniques lay the wire directly on top of the terminal areas of the chip as part of the wire embedding process. Additionally, a higher voltage is required to be used with thermal bonding process in order to accomplish both removal of the insulation and bonding of the wire to the terminal area than if the wire was insulated. As a result, the thermal bonding heads must be more frequently replaced, thereby increasing manufacturing costs, including a slowdown of production capacity while the heads are replaced. Moreover, even with complete removal of the insulation, a by-product or residue, such as hydrocyanic acid or other compounds, may remain at the bond site. It is believed that one or more of these residues may oxidize over time thereby further degrading the quality of the bond site and potentially shortening the life of the transponder.

It is therefore one object of the present invention to provide a method and apparatus for manufacturing RF and RFID inlays wherein fraud may be prevented by using a relatively thin wire antenna wire. Making the antenna wire of a minimum size makes removal of the antenna more difficult since the wire is more prone to breakage or damage during an attempted removal.

It is yet another object of the present invention to increase the life of RF and RFID devices wherein the quality of the electrical bonds between the antenna and chip bonding pads are improved by removing insulation from the wire prior to bonding, which also enhances the use of thinner antenna wire.

It is yet another object of the present invention to provide a method and apparatus of producing an RF or RFID inlay wherein known production equipment can be used to manufacture the inlay, thereby ensuring that the inlay of the present invention can still be incorporated within existing automated manufacturing processes.

SUMMARY OF THE INVENTION

In accordance with the present invention, a method and apparatus are provided for manufacturing RF inlays or similar devices. In one aspect of the present invention, it may be considered a method of making inlays. In another aspect of the present invention, it may be considered the apparatus or manufacturing equipment used for making the inlays. In yet another aspect of the present invention, it may be considered an apparatus for making the RF inlays, including various sub-combinations, that is, the various apparatus components to produce the RF inlay. In a further aspect, the present invention may be considered the resulting inlay device produced by the method or apparatus.

In accordance with the apparatus for making the inlays, one or more wire embedding heads, or sonotrodes as they may also be called, are used to embed antenna wire partially or fully into a substrate. The embedding heads may form the wire into virtually any pattern including forming the windings of an antenna. The substrate may accommodate one or a plurality of antennas. A single antenna may correspond to a single inlay or two or more antennas may be positioned in close proximity to each other and correspond to a single inlay. In the latter case, the plurality of antennas may be connected to a common chip/chip module or to different chips/chip modules and function independently. If a plurality of embedding heads is utilized, the embedding heads may move in unison or independently. Upon completion of the wire embedding at each transponder site, the wire is cut and either the embedding head(s) move to the next site or the substrate moves relative to the embedding head(s) to position new transponder sites proximate the embedding heads. Typically, the chip or chip module is placed on the substrate or in a recess formed in the substrate prior to any wire being embedded into the substrate. However, in the present invention, the chip or chip module may be placed in position after or during the wire embedding process.

The present invention provides an alternative approach of embedding wire into a substrate as described in the previously identified prior art patents and other known prior art. Rather than embedding the wire on one side of the terminal area of the RFID chip or chip module, guiding the wire directly over the terminal area, then embedding the insulated wire into the substrate on the opposite side of the terminal area, forming the antenna and then positioning the insulated wire directly over a second terminal area of the RFID chip and embedding it again, it is proposed that the embedding and bonding process begin with the wire adjacent to and laterally offset from the terminal area of a chip or chip module and that the wire not be passed over the terminal area. Rather, the wire is embedded into the substrate to form an antenna with the two end portions of the wire forming the antenna, not embedded in the substrate. The two end portions are positioned adjacent to and laterally offset from terminal areas of a chip or chip module. In one embodiment the full length of each of these end portions of wire are unsecured to the substrate. In a second step, after the antenna is formed, the end portions of the wire are moved into a position over or in contact with the terminal areas of the chip or chip module. The wire ends are not brought into contact with the terminal areas until after the antenna is fully formed, and bonding does not occur until the antenna is fully formed.

In a second embodiment of the invention, a first length of the wire is embedded in the substrate with the beginning portion of the first length of wire extending out of the substrate. This first length of wire is positioned adjacent to and laterally offset from a terminal area of a chip or chip module. A next continuous length of wire is not embedded in the substrate but is placed over the substrate. The next following length of wire is embedded into the substrate to form an antenna. Then, the next continuous length is positioned along the substrate but not embedded. Finally, a length of wire is embedded in the substrate with the final portion of that length of wire extending out of the substrate. The last two lengths of wire are positioned adjacent to and laterally offset from the terminal areas of a chip or chip module. The lengths of wire that are laterally offset from the terminal areas are then repositioned so that portions of those lengths of wire are positioned over or in contact with the terminal areas of the chip or chip module. These lengths of wire are not brought into contact with the terminal areas until after the antenna is fully formed.

In a third embodiment, a first end of the wire is affixed to or embedded in the substrate for a relatively short distance of approximately 0.5 to 1.0 centimeters, although this length may vary. The ultrasonic transducer is then preferably turned off and the embedding head raised a distance away from the surface of the substrate. Because the prior length of wire is fixed to the substrate, a further or second length of wire is pulled from the wire supply as the embedding head is raised. The embedding head then moves parallel to the plane of the substrate causing more wire to be pulled from the wire supply. Then, the head is lowered to a position close to the substrate, the ultrasonic transducer is turned on, and a further length of wire is embedded in the substrate. As a result of the actions of turning off the ultrasonic transducer and the continued movement of the embedding head, a portion of the wire is not fixed to or embedded in the substrate but rather forms a loop or bridge of wire extending above the plane of the substrate. This loop of wire is formed at a position laterally offset from the terminal areas of the chip or the chip module, with the term laterally offset being defined by the plane of the substrate. Preferably, the loop of wire is formed perpendicular to the plane of the substrate, but this is not a requirement of the invention. The process of fixing the wire to or embedding the wire in the substrate continues such that an antenna is formed on or in the substrate and then a second loop or bridge of wire is similarly formed at a second location on the substrate, typically but not necessarily on the opposite side of the chip or chip module from the first loop of wire. In the process of forming the two loops of wires, the loops are formed at positions offset or spaced from the terminal areas and chip, and therefore no portion of the loops are positioned over or in contact with any portion of the chip or terminal areas.

In a subsequent processing step, a portion of the insulation material that encapsulates the antenna wire along a portion of the loops of wire is removed. More specifically, in a fourth embodiment, a laser is used to strip away the insulation from the wire along a discrete length of the loop portion of the wire. The locations where the insulation has been stripped from the loops are the areas that will make electrical contact with and will be bonded to the terminal areas. As previously noted, the loops are offset or spaced from the terminal areas such that the loops are not positioned directly over or in contact with the terminal areas of the chip or chip module. This positioning permits a laser to be focused on the loops of wire to remove a discrete portion of the insulation from the loops without striking or damaging the terminal areas or the chip itself. If the loops of wire were positioned directly over, in contact with or even very close to the terminal areas of the chip or chip module, the laser may damage the terminal areas and thereby impair the ability to bond the wire to the terminal area or cause an inferior bond to be formed, or it may directly damage the chip itself.

In a subsequent processing step, the apparatus includes a wire-displacing tool that is used to displace the loops in a position such that they may then be bonded to the designated terminal areas. In the preferred embodiment of the present invention, a pair of jaws or fork shaped elements are used to engage the loops of wire and to displace and reform the loops so that at least some portion of the wire loops are centered directly over and/or in contact with the terminal areas of a chip or chip module or an area or region where the terminal areas will ultimately be positioned. In another preferred embodiment, in lieu of fork shaped elements to move or engage the loops, other means may be provided to position the loops in contact with the terminal areas, such as by use of a brush or comb device. Instead of forming loops, it is also contemplated that the lengths of wire that are located adjacent to the terminal areas can simply be lengths of wire that lie on top of the substrate, e.g., are not fixed to or embedded in the substrate, and then are displaced over the terminal areas either by the forked shaped elements or other means, including but not limited to a brush, a comb or even manually. One end of each length of wire could be unattached to the substrate thereby allowing each length of wire to be simply moved to a position in contact with the corresponding terminal area where the wires are to be attached.

In yet a further processing step in accordance with the method and apparatus of the present invention, a bonding element is provided that electrically connects the lengths of wire or loops of wire positioned over or in contact with the terminal areas to the designated terminal areas. Bonding does not occur until the antenna is fully formed.

It should be appreciated that these processing steps may all occur at a single location or may occur at multiple locations. For example, a single head element may include the ultrasonic embedding tools, the tool to reposition the lengths of wire over or in contact with the terminal areas, a laser and the bonding tool. Alternatively, these tools may be positioned on two or more separate heads or each positioned on a separate tool head. Still further, the substrate may be moved to different positions for some or all of these process steps while the tools remain stationary.

Various other features and advantages will become apparent from a review of the following detailed description taken in conjunction with the drawings.

BRIEF DESCRIPTION OF THE DRAWINGS

FIG. 9 is another schematic view illustrating another processing step for manufacture of the RF and/or RFID inlay wherein a laser is used to remove insulation material from the insulated wire forming the antenna coil;

FIG. 10 is a greatly enlarged elevation view illustrating the laser that has stripped the insulation material away from a designated location on the insulated wire;

FIG. 11 is a plan view illustrating the location of the laser beam that strips the insulation material and the spaced orientation of the laser to prevent damage to the chip module;

It should be appreciated that even though a chip module is shown in the foregoing described figures, a chip may be substituted for a chip module (or vice versa) without departing from the scope of the present invention. Additionally, the wire shown in FIGS. 1-23 is insulated unless otherwise indicated. However, it should be appreciated that uninsulated wire could be used with the present invention, provided care was taken to avoid creating a short circuit. In this case, the insulation removal step would be omitted.

DETAILED DESCRIPTION

Figure 1:
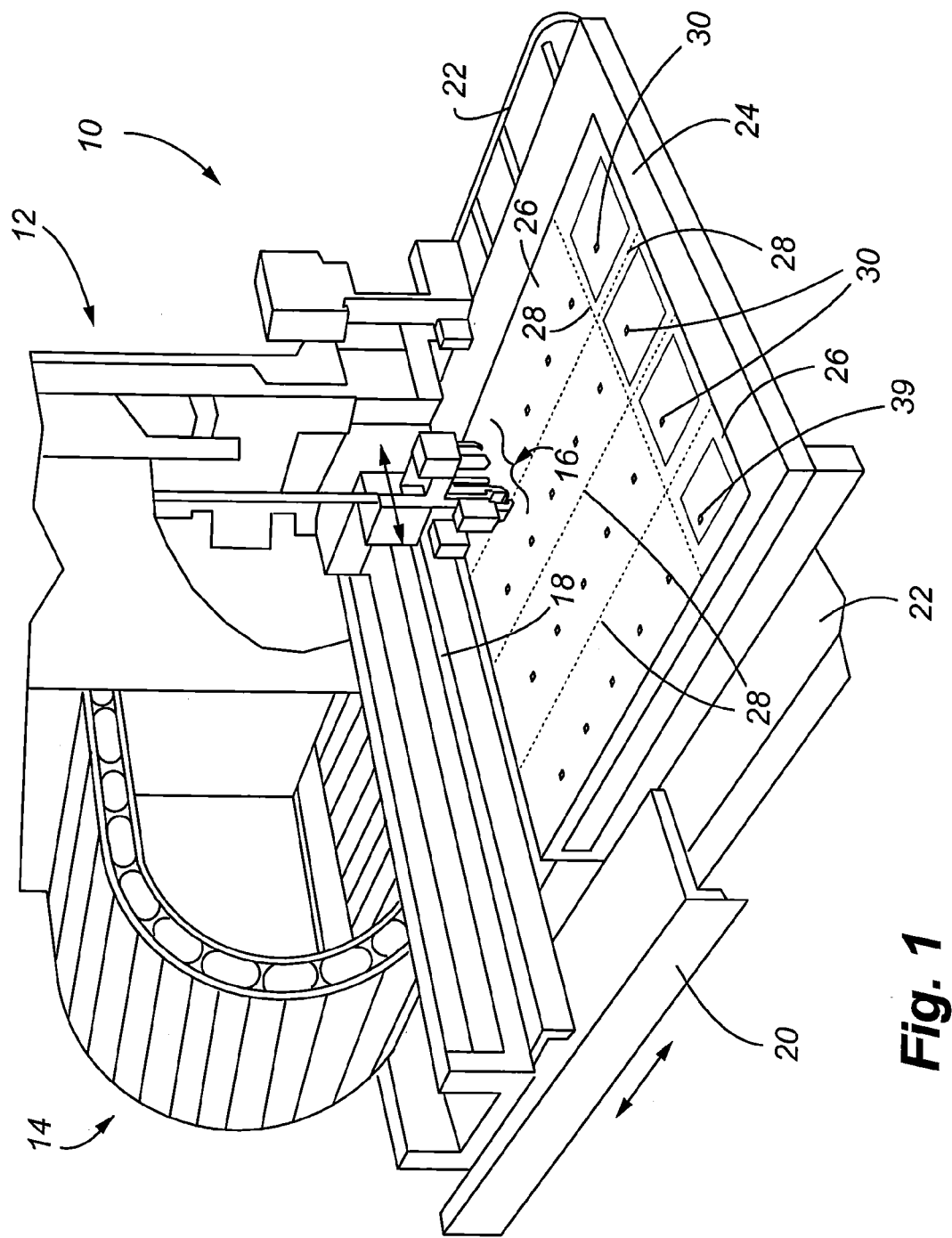
FIG. 1 is a fragmentary perspective view of a processing machine used to manufacture RF and/or RFID inlays.

FIG. 1 illustrates one embodiment of a processing apparatus or machine 10 for manufacturing RF and/or RFID inlays. The machine 10 may be generally described as including a power drive group 12, a flexible communications bus 14 that transfers operational instructions from a computer processor (not shown) and power to the working components of the machine. For example, the bus 14 may facilitate the transfer of electronic signals between the processor and the working elements 16 of the machine that creates the inlays. As discussed further below, the working elements 16 may include a group or combination of one or more embedding tools, lasers, wire cutters and thermal bonding heads. The working elements 16 traverse laterally across a support table 24 that secures a substrate 26 forming the bodies of the inlays. In the example machine shown in FIG. 1, a lateral slide rail 18 allows the working elements 16 to traverse in the lateral direction across the substrate 26. A longitudinal frame 20 secured to the lateral side rail 18 allows the machine to traverse or index in the longitudinal direction along longitudinal side rails 22. The dashed or phantom lines 28 designate or outline the prospective individual inlay devices to be formed from the common substrate 26. Reference number 30 is a chip or chip module previously placed on the substrate, or designates a recess where a chip or chip module may be placed in the future. As mentioned, each inlay device has at least one transponder comprising an integrated circuit chip or chip module and a wire antenna that is connected to the chip or chip module. A CNC or similar controller controls the positioning and movement of the working elements 16 relative to the substrate 26.

Figure 2:
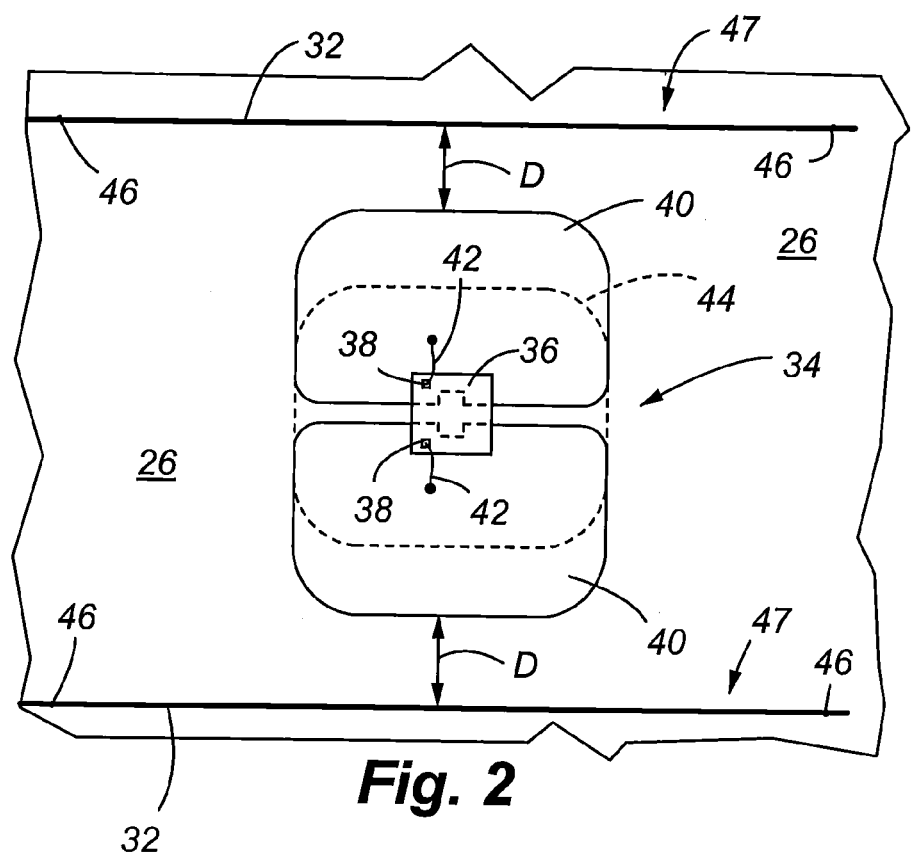
FIG. 2 is an enlarged plan view of a portion of an RF or RFID inlay specifically illustrating a chip module positioned on a substrate, and placement of opposing ends of the antenna coil adjacent the chip module.
Figure 3:
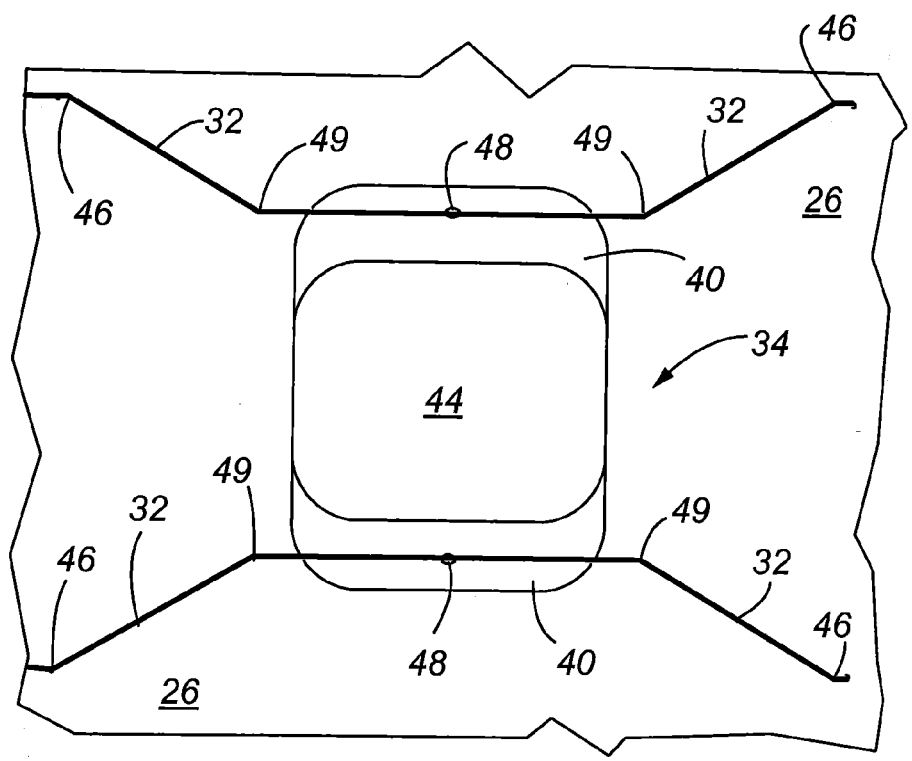
FIG. 3 is another enlarged plan view illustrating the opposing ends of the antenna coil secured to the terminal areas of the chip module.

Referring to FIGS. 2 and 3, a portion of an RF or RFID inlay device (hereinafter "device") is illustrated. In accordance with the present invention, the device includes the substrate 26, typically made of a thermoplastic material or other material receptive to wire embedding (or may comprise a layer of material receptive to wire bonding affixed to the surface of a substrate, such as an adhesive layer), a chip module 34, and an antenna element formed by a continuous length of wire 32. The chip module 34 in a known construction includes an integrated circuit 36 and at least one pair of terminal pads or terminal areas 40. Bonding pads 38 formed on the integrated circuit 36 are electrically connected to the terminal areas 40 by means of one or more very small leads or conductors 42. A protective layer of material such as epoxy 44 covers the integrated circuit 36, portions of the respective terminal areas 40 and the interconnecting conductors 42. Alternatively, the chip module may be constructed and assembled in other ways known to those of skill in the art or the integrated circuit 36 may be used in place of a chip module 34, in which case the antenna wire 32 is directly bonded to the bonding pads 38.

Figure 4:
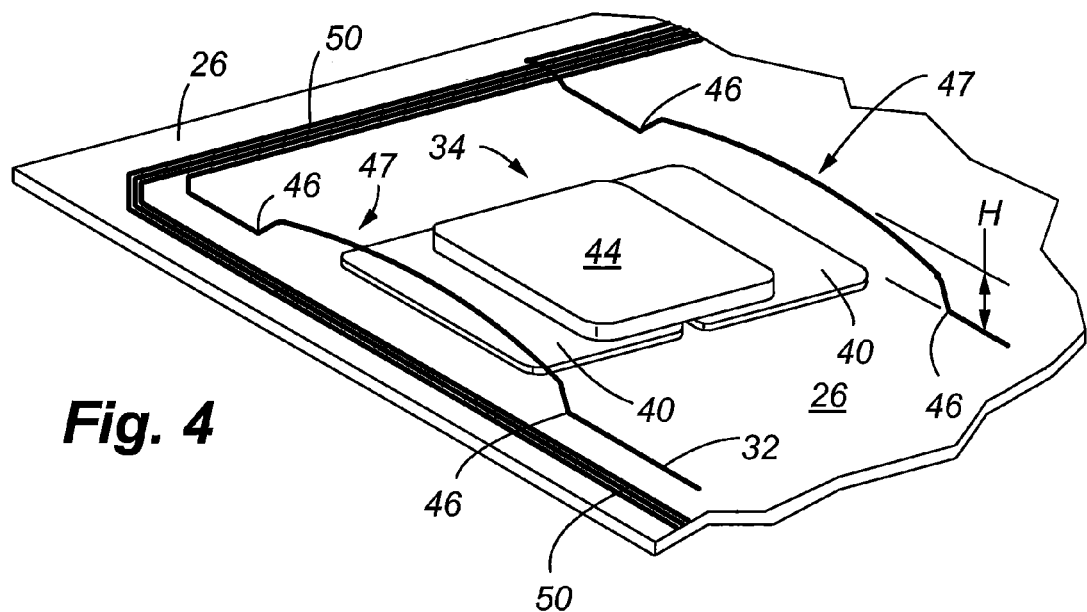
FIG. 4 is an enlarged fragmentary perspective view of the inlay of FIG. 2 illustrating the chip module and antenna coil including portions of the opposing ends of the antenna coil configured in loop shapes prior to attachment of the ends to the terminal areas.
Figure 5:
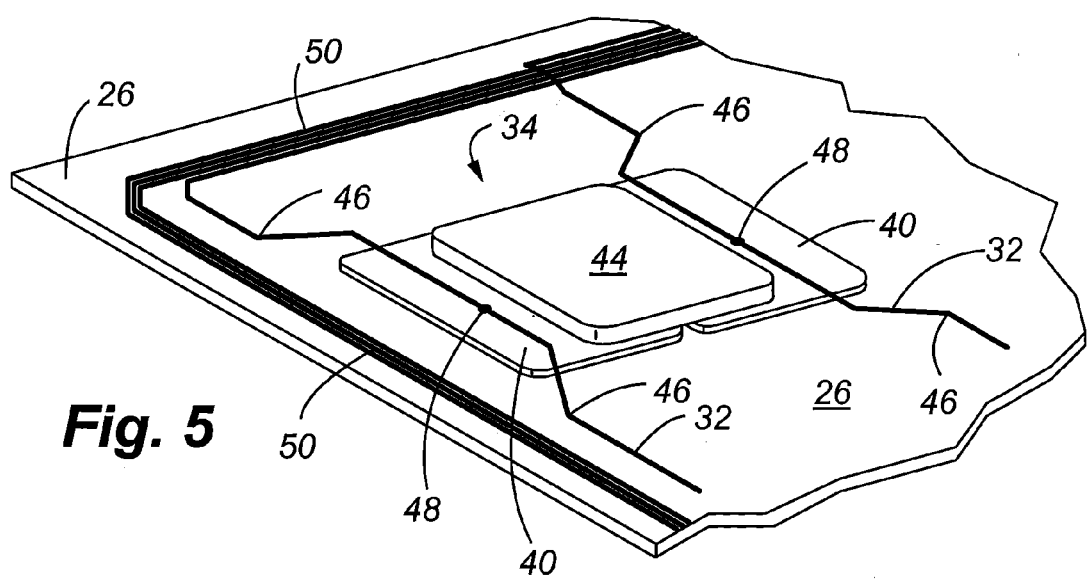
FIG. 5 is an enlarged fragmentary perspective view of FIG. 3 illustrating the inlay wherein portions of the opposing ends of the antenna coil are secured to the terminal areas of the chip module.

The portions of the insulated wire 32 shown in FIGS. 2 and 3 are the opposing ends of the wire that form the antenna, although this is more easily seen and understood with reference to FIGS. 4 and 5. During manufacture, portions of the opposing ends of the wire are formed into a loop or bridge above the surface of the substrate, as shown in FIG. 4. Subsequently, the loops are displaced from the position shown in FIGS. 2 and 4 to the position shown in FIGS. 3 and 5. A portion of each loop is then bonded to the respective terminal areas 40 at bonding points 48. As shown in FIG. 2, there is a distinct lateral offset or gap defined by distance D between the wire 32 and terminal area 40 such that the wire is not guided or positioned over or in contact with the terminal area 40 as it is positioned on or affixed to the substrate. In the preferred embodiment, only after the wire 32 is completely affixed to the substrate to form an antenna are the loops displaced for purposes of bonding a portion of the loops to the terminal areas. Nonetheless, it should be understood that the loops may be displaced before the wire embedding process is completed. However, with respect to this first embodiment, it should be appreciated that both ends of a loop must be secured in some fashion, such as embedded in or affixed to the substrate at points 46, before the loop may be displaced. If only one end is fixed in place and the other end is not fixed to the substrate or otherwise secured in some manner, displacement of the loop will not work in a reliable or repeatable manner. As will be appreciated in connection with other embodiments, one end of the wire may be loose or not fixed to the substrate.

With further reference to FIGS. 4 and 5, the device is shown wherein the antenna element is formed in a plurality of tracks or concentrically arranged coils 50. In FIG. 4, the opposing ends of the wire 32 are formed as loops 47 that extend generally orthogonally above the upper surface of the substrate and adjacent to but not over any portion of the chip module 34. As smaller diameter wire is used, the loop may not extend orthogonally to the substrate but may take a different position. The protruding loops 47 and their spaced arrangement from the chip module allows a selected amount of insulated material to be removed from the wire prior to electrical bonding of the wire to the terminal areas. In FIG. 5, the insulated wire 32 has been displaced such that the wire loops are forced to a position directly above or into contact with the terminal areas 40. Portions of the wire loops are then thermally bonded to the terminal areas to make an electrical connection.

Figure 6:
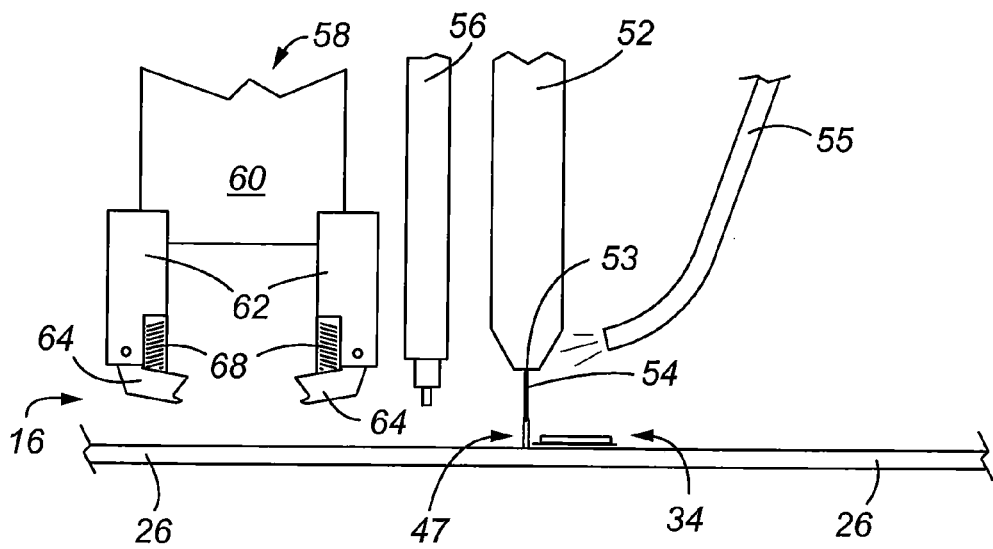
FIG. 6 is a schematic view illustrating working components of the processing machine for manufacture of the RF and/or RFID inlay, and specifically illustrating (i) an embedding tool for securing the antenna coil to a substrate (ii) a laser for removing insulation from an insulated wire and (iii) a wire displacing tool for displacing the antenna wire loops prior to bonding to the terminal areas.

FIG. 6 illustrates further details of the working elements 16 of the machine 10. The working elements 16 include at least one embedding tool 52 that is used to embed the insulated wire 32 fully or partially into the substrate 26. As understood by those skilled in the art, the embedding tool 52, utilizes high frequency or ultrasonic oscillation in order to embed the insulated wire into the substrate. The embedding tool travels in a pre-programmed pattern under the direction of a processor or controller to form the desired shape or pattern for the antenna. In FIG. 6, the insulated wire 32 is dispensed from the tip 53 of the embedding tool. The insulated wire that is dispensed but not yet attached to the substrate 26 is shown as insulated wire 54. A tube 55 positioned adjacent the embedding tool can be used to deliver a flow of air to cool the embedding head. The other working elements 16 include at least one laser 56 that is used to remove the insulation material from the insulated wire, at least one wire displacing tool 58 that displaces the wire loops to the positions shown in FIGS. 3 and 5 such that wire may then be secured to the terminal areas, and a wire cutter (not shown) that cuts the wire and permits the machine to move relative to the substrate and form the next antenna. The elements 16 may move together as a single group to make the inlays, or various combinations of the elements 16 may be positioned at different locations or individually positioned at different locations to most efficiently manufacture an array of inlays formed from the common or separate substrate 26.

Since the antenna is a single, continuous length of insulated wire, the embedding tool 52 must travel in a predetermined pattern to dispense the wire such that the loops and concentric windings are formed without breaking continuity in the wire. Thus, in the making of the antenna, a first step in the process is to form one of the loops 47 generally proximate to but laterally offset from the chip module 34 relative to the plane of the substrate 26. Next, the wire is affixed to the substrate in the form of an antenna pattern and then the embedding tool forms the second loop 47 generally proximate to but offset from an opposite side of the chip module. It should be appreciated that the location of the formed loops of wire is generally proximate the location of the respective terminal areas to which each loop of wire will be attached. After the second loop has been formed, the insulated wire is cut, and the embedding tool 52 may then move to the next location on the substrate for formation of the next antenna, the substrate is moved relative to the embedding tool or some combination of relative movement occurs between the embedding tool and substrate.

Figure 7:
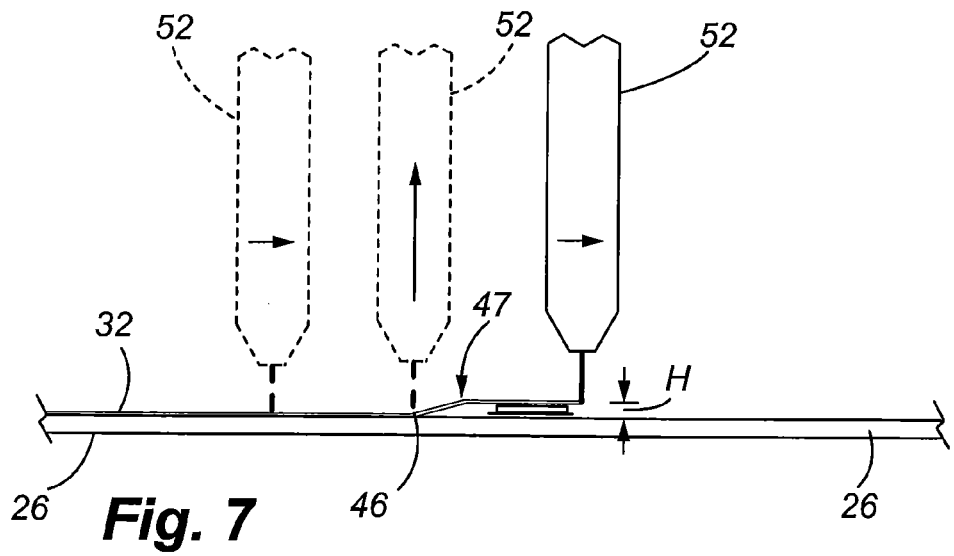
FIGS. 7 and 8 are schematic views of the embedding tool illustrating the sequence by which the opposing ends of the antenna coils are located adjacent to the chip module.
Figure 8:
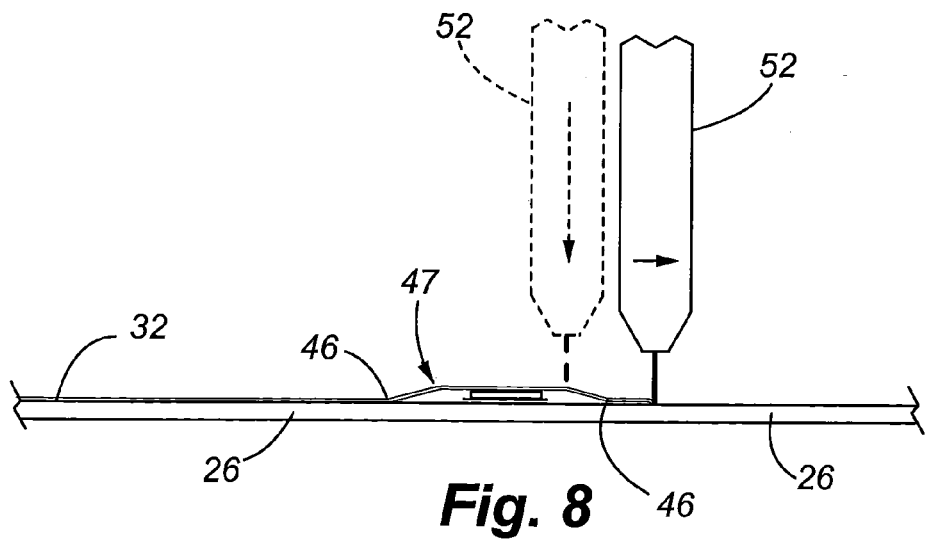

Referring to FIGS. 7 and 8, an operational sequence of the embedding tool 52 is illustrated for forming the second loop of the pair of loops 47, but it should be appreciated that the process is nearly identical for forming the first loop. From left to right in FIG. 7, the sequence is shown as dispensing the wire from the tool 52 and embedding the insulated wire 32 in the substrate 26, then upward movement of the embedding tool 52 to raise the insulated wire to a designated height H above the upper surface of the substrate 26 while sequentially or simultaneously turning off the ultrasonic source, and then horizontally traversing the embedding tool at the designated height for a desired distance forming a wire loop 47 of a generally known length. Referring to FIG. 8, the embedding tool 52 is then moved downward, the ultrasonic source is turned on and the end of the wire is embedded in the substrate 26 for a distance. At this point, the insulated wire can be cut and the embedding tool can move to the next station on the substrate to form the next antenna pattern. The embedding tool forms the first loop 47 in the same general sequence as described with reference to FIGS. 7 and 8. However, instead of cutting the wire after formation of the loop, the embedding tool continues embedding wire to form the antenna and the second loop. As previously noted in connection with the present embodiment, the wire must be affixed to the substrate at 46, on both sides of the loops or otherwise secured in some fashion, in order for the loops to be displaced in subsequent handling.

Referring now to FIGS. 9-11, the insulation removal aspect of the invention is shown in operation. In order to improve the quality of the electrical bond between the antenna and the chip or chip module, particularly when working with small diameter wire of 60 microns or less, it is desirable to remove a portion of the insulation material that encapsulates the metal conductor. The laser 56 generates a laser or ultraviolet light beam 57 that contacts a defined portion of the loops 47 in order to remove a selected amount of insulation. As shown in FIG. 10, the laser beam 57 is directed to remove the designated portion of the insulation material 72, thereby exposing the interior metal conductor 74. As shown in FIG. 11, a circular pattern 76 represents that portion of the substrate contacted by the laser beam 57. The size and shape of the beam emitted by the laser may be altered to meet system requirements and space limitations. It is noted that the laser beam 57 does not strike any portion of the chip or chip module 34, thereby preventing any damage to the chip, chip module or their respective terminal areas. The gap or distance D between the insulated wire and the chip module ensures the insulation material can be safely removed without contaminating or damaging the bond site with controlled use of the laser. The laser 56 is shifted or indexed from one loop to the next in order to sequentially treat each loop. As necessary, a protective jacket or shroud (not shown) may be utilized in combination with the laser 56 to restrict inadvertent reflection of the laser light towards the chip module or towards the operator of the equipment. Additionally, it may be desirable to place a temporary protective pad (not shown) directly underneath the wire loop being treated with the laser such that the laser does not burn a hole through or otherwise irreparably damage the substrate. The protective pad could be incorporated in a controllable arm that is incorporated with the working elements 16 wherein the pad is placed during operation of the laser, and then retracted. As a result of the foregoing process, the insulation is fully removed from a defined portion of the wire and any residue or by-product from the removal process is eliminated by the laser or harmlessly settles on the substrate at a position safely removed from the terminal areas of the chip and/or chip module.

Figure 12:
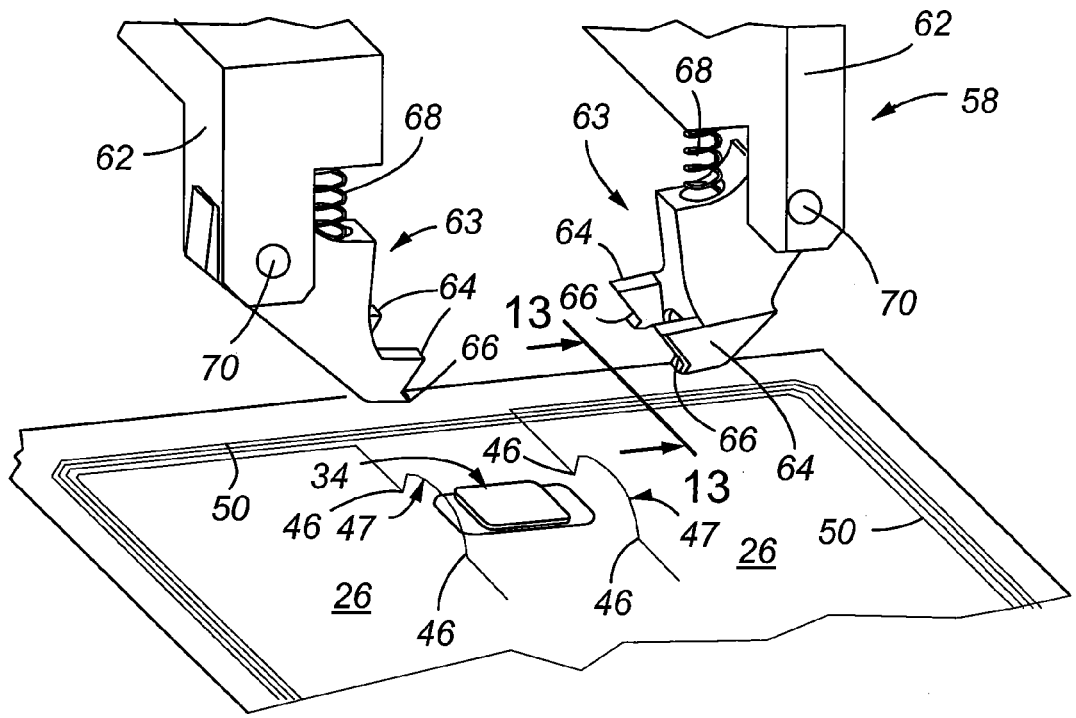
FIG. 12 is a fragmentary perspective view of the wire-displacing tool prior to engaging the wire loops.
Figure 13:
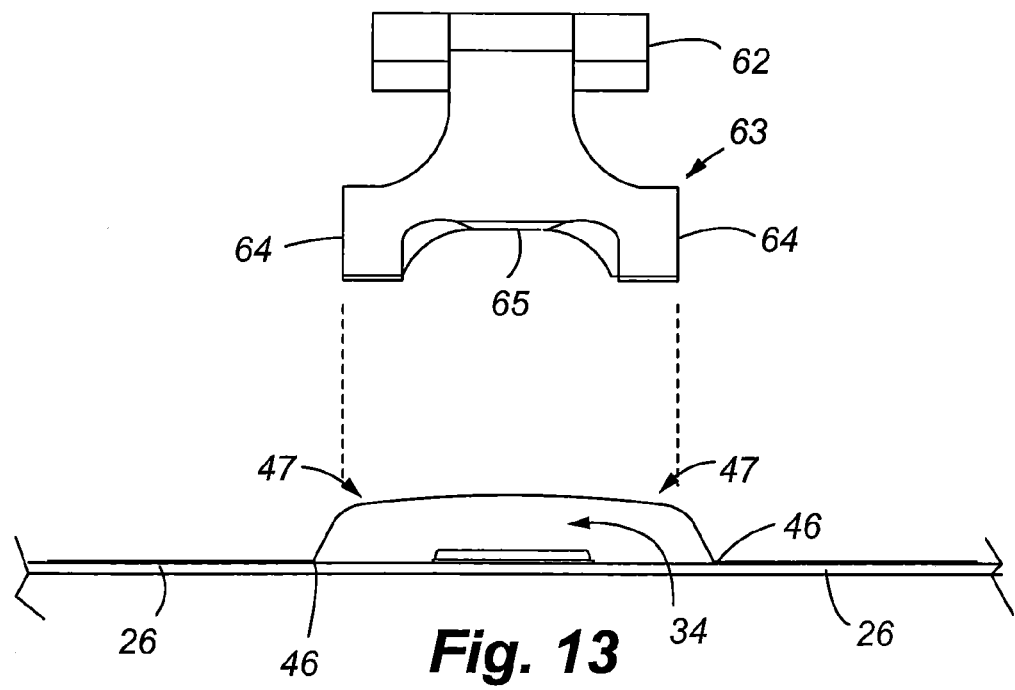
FIG. 13 is an enlarged end view taken along line 13-13 of FIG. 12 illustrating one of the jaw assemblies and its orientation with respect to one of the wire loops to be engaged.
Figure 14:
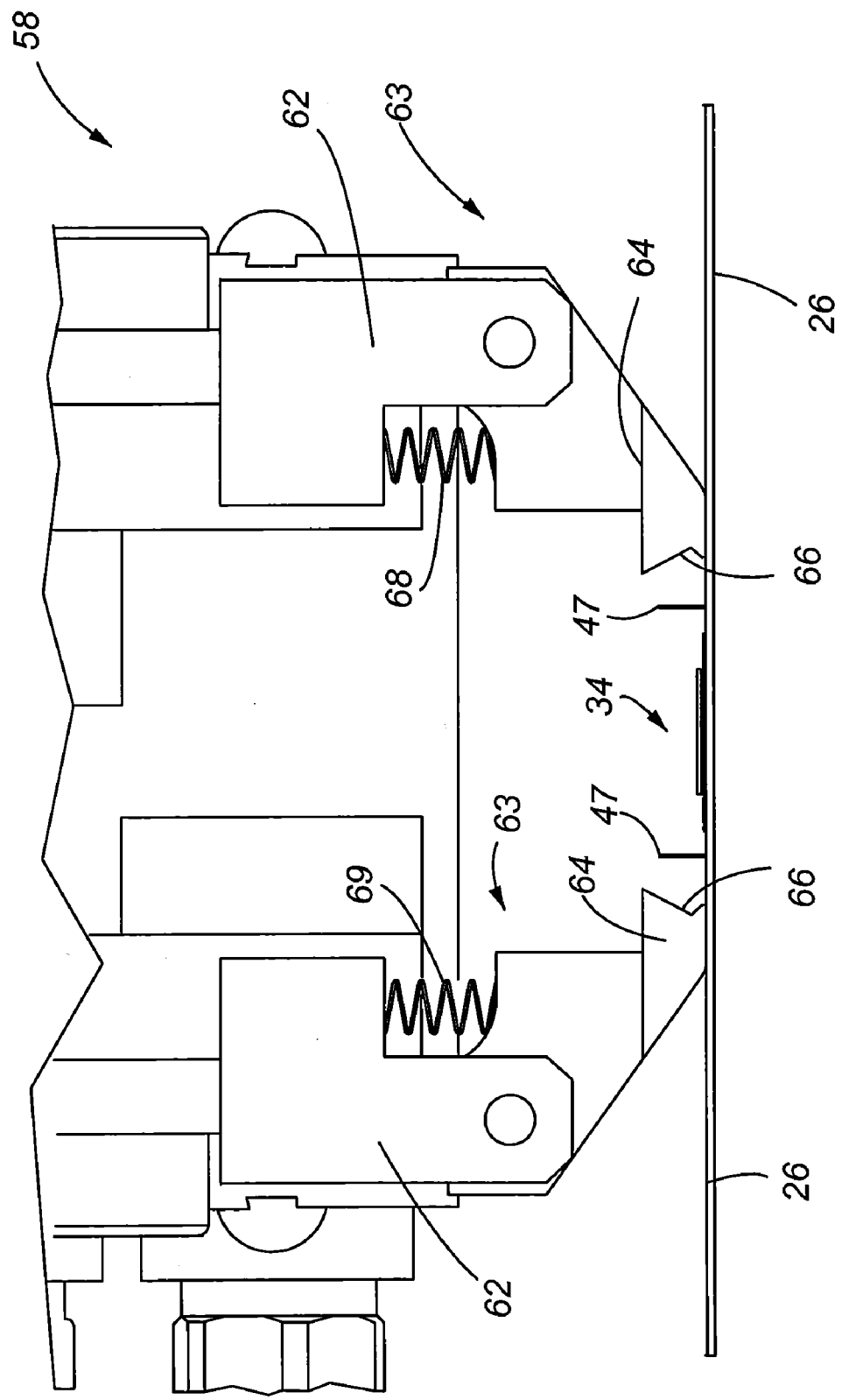
FIG. 14 is an elevation view of the wire-displacing tool wherein the tool has been lowered and the lower surfaces of the jaw assemblies are placed in contact with the upper surface of the substrate.
Figure 15:
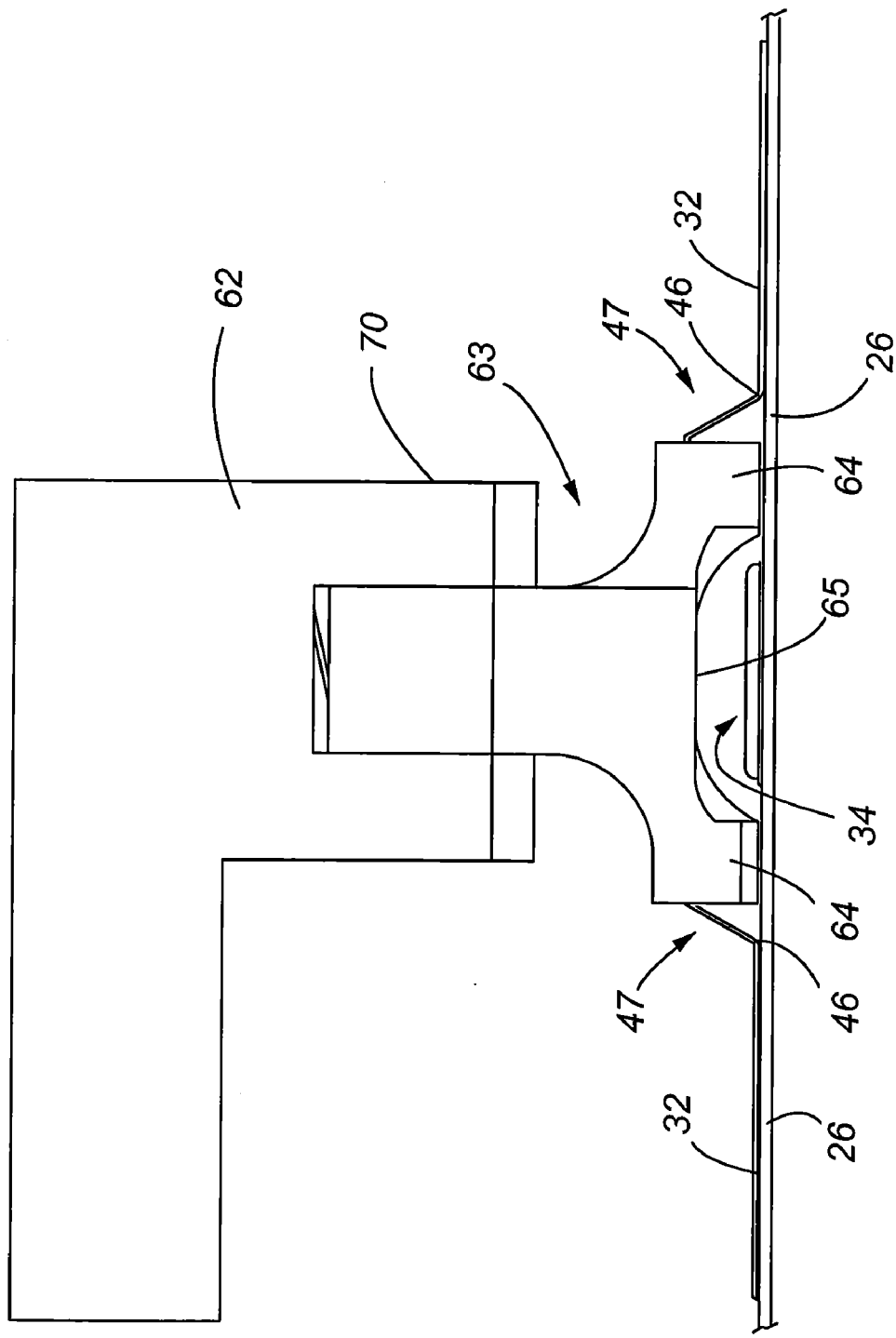
FIG. 15 is an enlarged end view similar to FIG. 13 but showing the jaw assembly in the lowered position of FIG. 14 and showing the back or opposite side of the jaw assembly.
Figure 16:
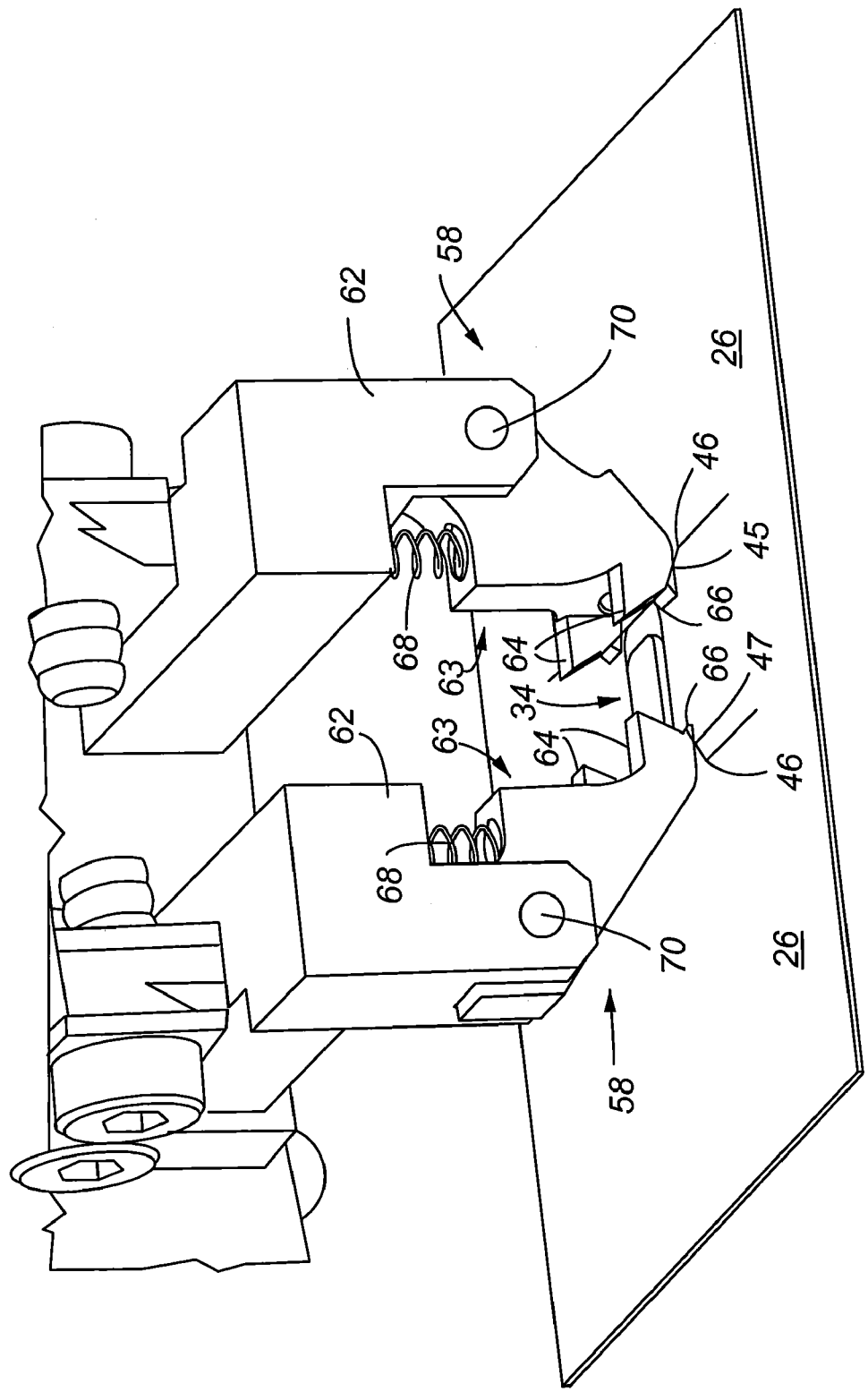
FIG. 16 is a perspective view showing the wire-displacing tool after the wire loops have been engaged and displaced by movement of the jaw assemblies.
Figure 17:
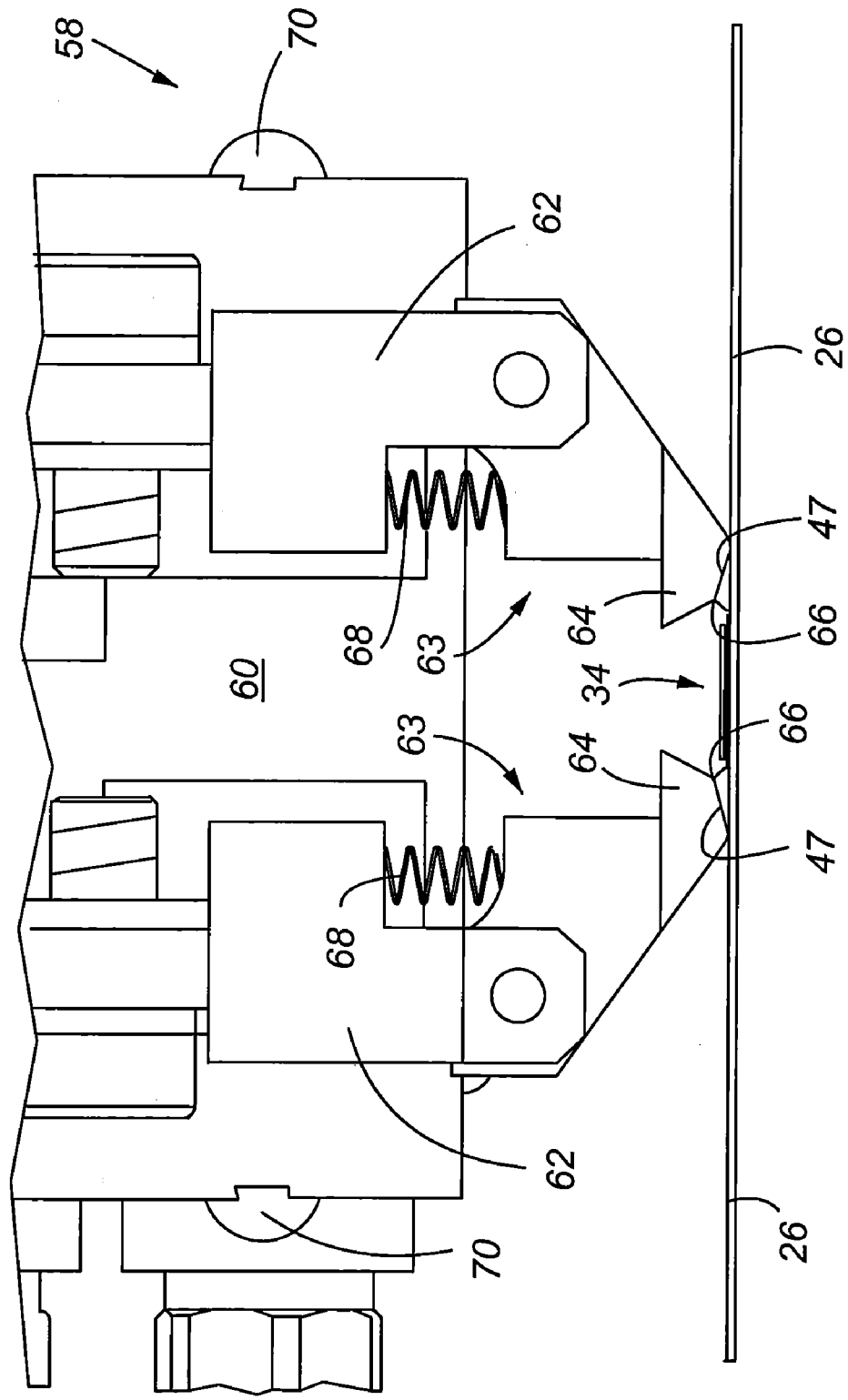
FIG. 17 is an elevation view of the wire-displacing tool in the position of the tool shown in FIG. 16.

Now referring to FIGS. 12-18, the wire-displacing tool 58 is shown in operation. Referring first to FIGS. 12-14, the construction of the tool 58 is characterized by (i) a frame 60, (ii) a pair of vertical supports 62, (iii) a pair of jaw assemblies 63 wherein each jaw assembly includes a pair of spaced jaws 64, and (iv) a pair of springs 68 that bias the rotational movement of the jaw assemblies 63 about respective pins 70. Each of the jaws 64 includes a notch 66 that engages the loops 47 as discussed below. The wire-displacing tool 58 is lowered from the position of FIG. 12 such that the lower edges of the jaws 64 contact the upper surface of the substrate 26 as shown in FIG. 14. As the jaw assemblies 63 make contact with the substrate, the pairs of jaws 64 rotate toward one another about the pins 70 so that the lower surfaces of the pairs of jaws sit flush on the upper surface of the substrate 26. Referring to FIG. 15, a central arch 65 of each of the jaw assemblies 63 allows the jaw assemblies to move toward the chip or chip module without the jaws or any other portion of the jaw assemblies striking the chip or chip module and, therefore movement of the jaws does not risk changing the position of the chip or chip module. Referring to FIGS. 16 and 17, the jaws are moved toward one another so that each loop 47 is engaged with one of the pairs of jaws and the wire loops are secured in the notches 66. The loops are displaced by respective movement of the jaws toward a terminal area of a chip or chip module. More specifically, the wire comprising the loops 47 bends or deforms in response to the inward movement of the jaws. As best seen in FIG. 3, the shape of the deformed loop comprises three distinct linear segments due to the location of the embedded or fixed areas 46 and the shape of the notches 66 of the jaw assemblies 63 which cause the loop to bend at location 49 as well as at location 46. The loops therefore are displaced to a position directly above and perhaps in contact with at least a portion of the terminal areas 40.

Figure 18:
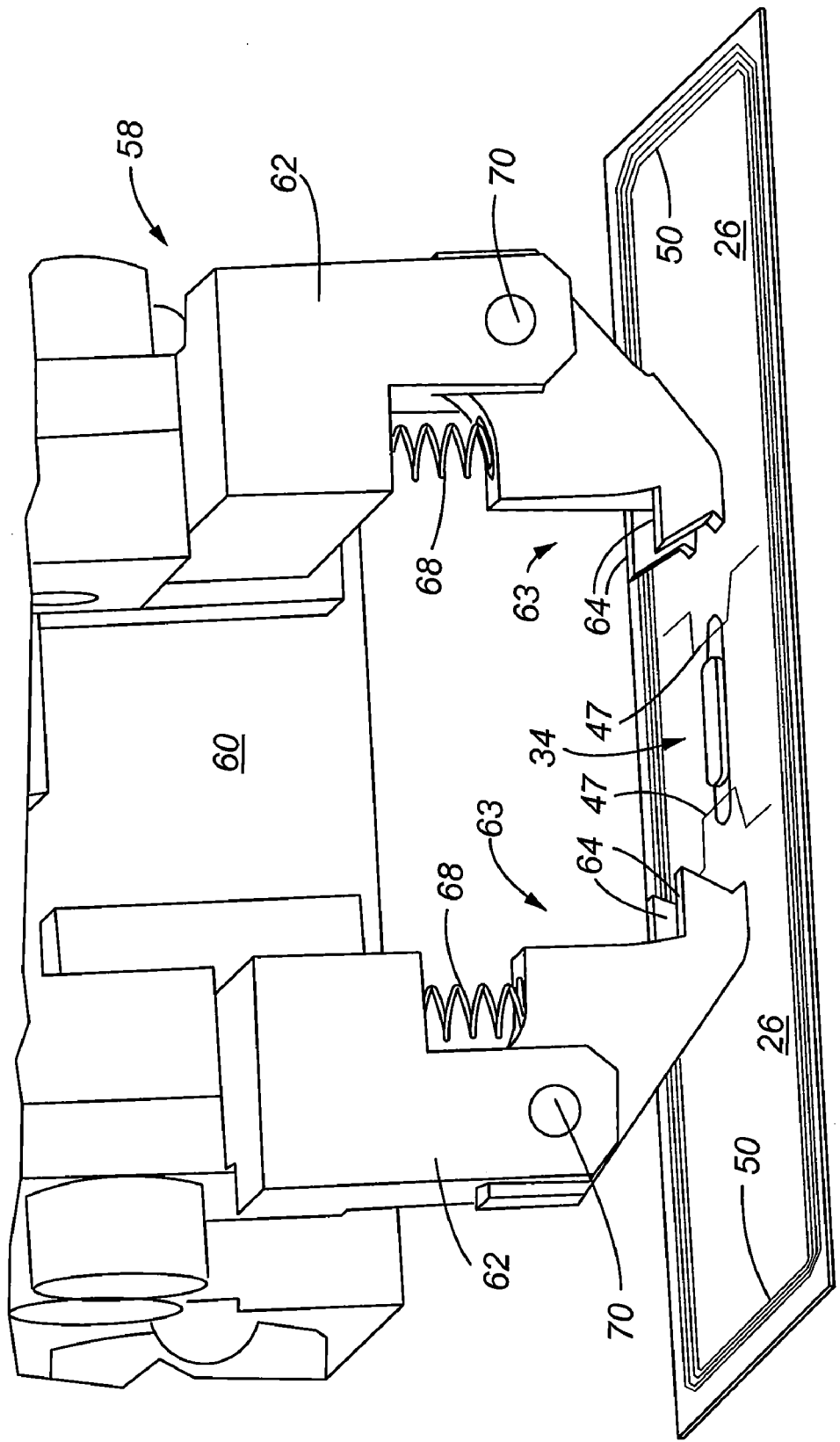
FIG. 18 is a perspective view showing the jaw assemblies disengaged from the wire loops after the loops have been displaced.

Referring to FIG. 18, the jaw assemblies have been disengaged and the wire loops have been displaced to a position where they can then be bonded to the respective or corresponding terminal areas. In the preferred embodiment, the inward or pinching movement of the opposed jaws is limited by adjustable physical stops which prevent the jaws from too large of a movement which could dislodge portions of the wire fixed in the substrate at point 46 and thereby potentially misposition the loop wire relative to the terminal areas of the chip or chip module. The length of wire forming each loop 47 and its height H together with the shape or profile of the jaws define the maximum distance the jaws 64 may move. As should be appreciated, the distance D at which the wire 32 is offset from the chip module 34 may be adjusted by adjusting the height H and/or length of the loop of wire.

Figure 19:
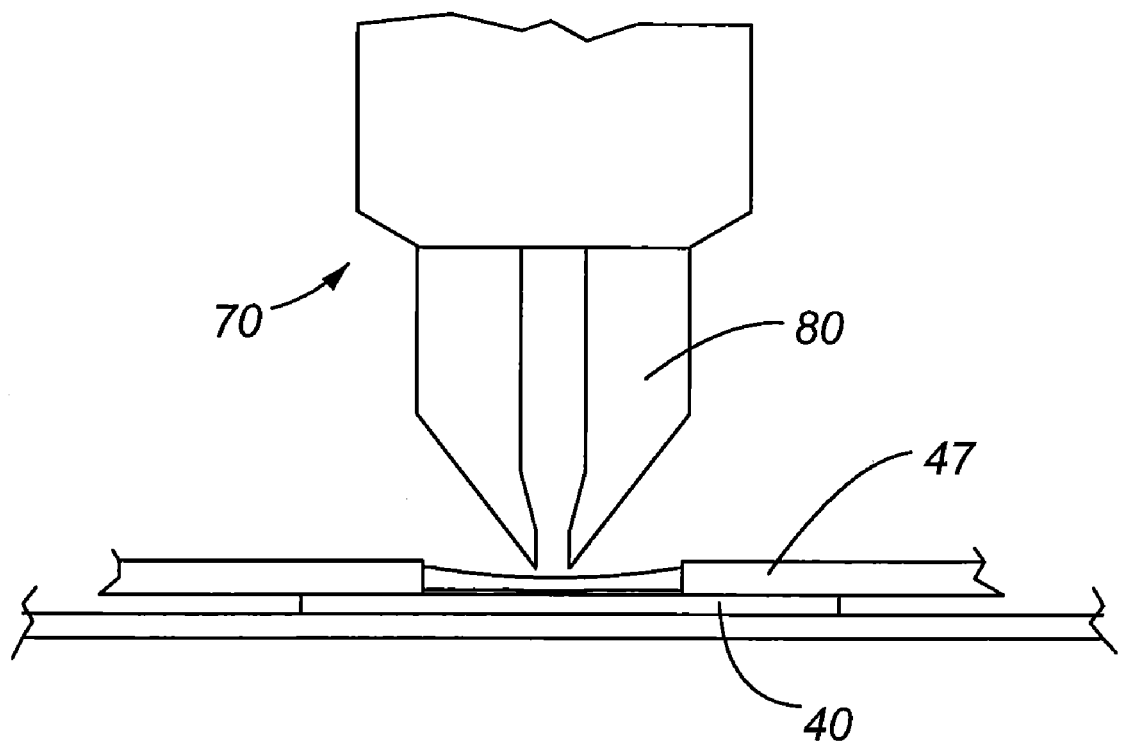
FIG. 19 is a schematic view of a thermal bonding head that creates the thermal compression bond between the antenna wire and the terminal area of a chip or chip module and the resulting electrical connection between the exposed conductors on the wire portions and the respective terminal areas.

Referring now to FIG. 19, another working element 16 is shown, namely, the thermal bonding head 80 that is used to electrically bond the loops 47 that have been displaced the position above the respective terminal areas 40. In this figure, the thermal bonding head 80 is shown as compressing one of the loops 47 in contact with one of the terminal areas 40. The thermal bonding head generates a voltage sufficient to electrically bond the loops to the terminal areas. Like the laser 56, the bonding head 80 is indexed or shifted from one bonding site to the next in order to sequentially bond each loop to its corresponding terminal area.

Figure 20:
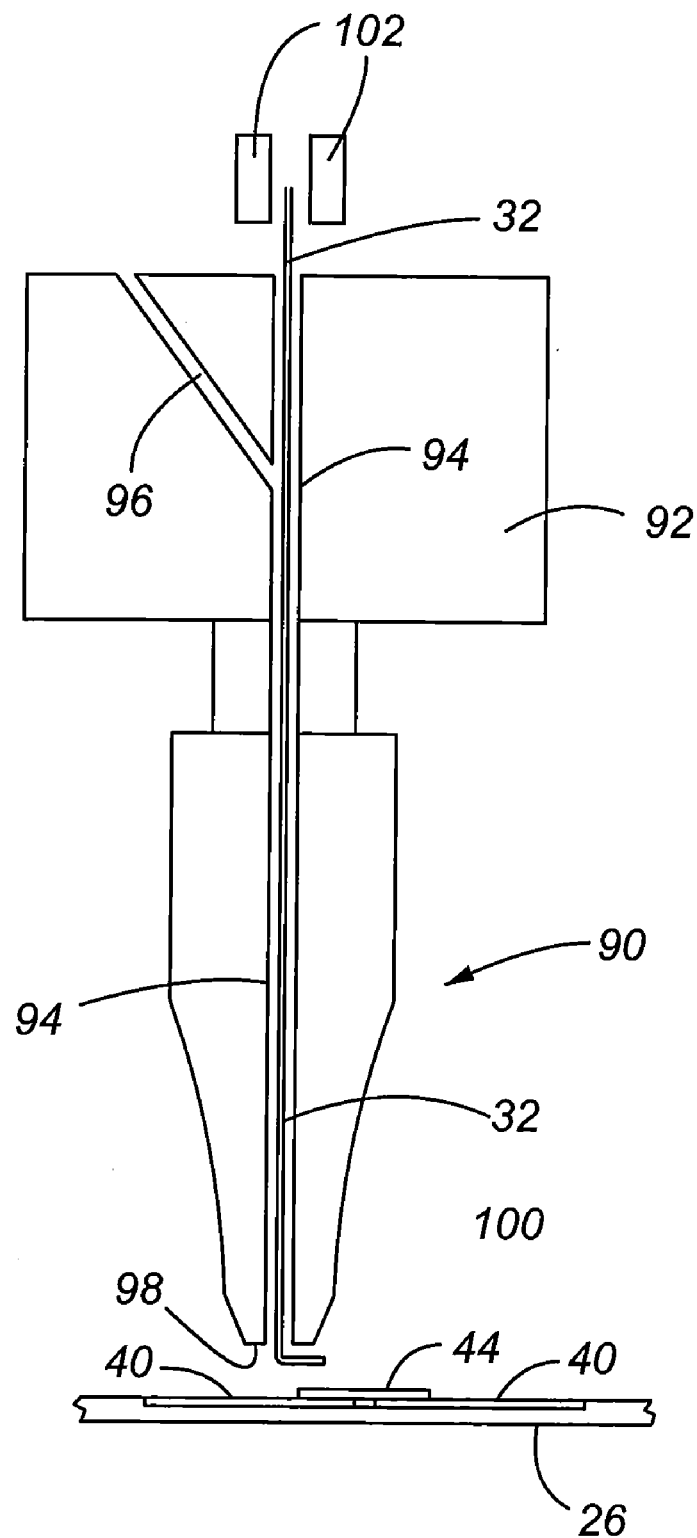
FIG. 20 is a schematic view of an embedding tool such as a sonotrode having a length of residual wire extending from the end of the capillary tube having been previously cut following completion of wire placement in an RF device.

FIG. 20 illustrates an example of an embedding device such as an ultrasonic sonotrode 90. The sonotrode includes a manifold 92 which houses a capillary tube 94 and a compressed air channel 96 that communicates with the capillary tube 94. The wire 32 is routed through the capillary tube so that it can be dispensed from the distal tip 98 of the sonotrode. A wire clamping mechanism 102 controls the feed of wire. The clamping mechanism jaws close together to prevent feed of the wire. The compressed air can control the rate at which the wire is dispensed from the capillary tube when the jaws are open.

At the completion of laying wire at a previous RF device, the wire 32 is cut leaving a residual amount of wire 100 extending from the distal tip of the embedding tool. This residual amount is equal in length to the distance between the embedding tool and the cutting tool (not shown). This residual amount of wire is used for the next RF site to be manufactured.

Figure 21:
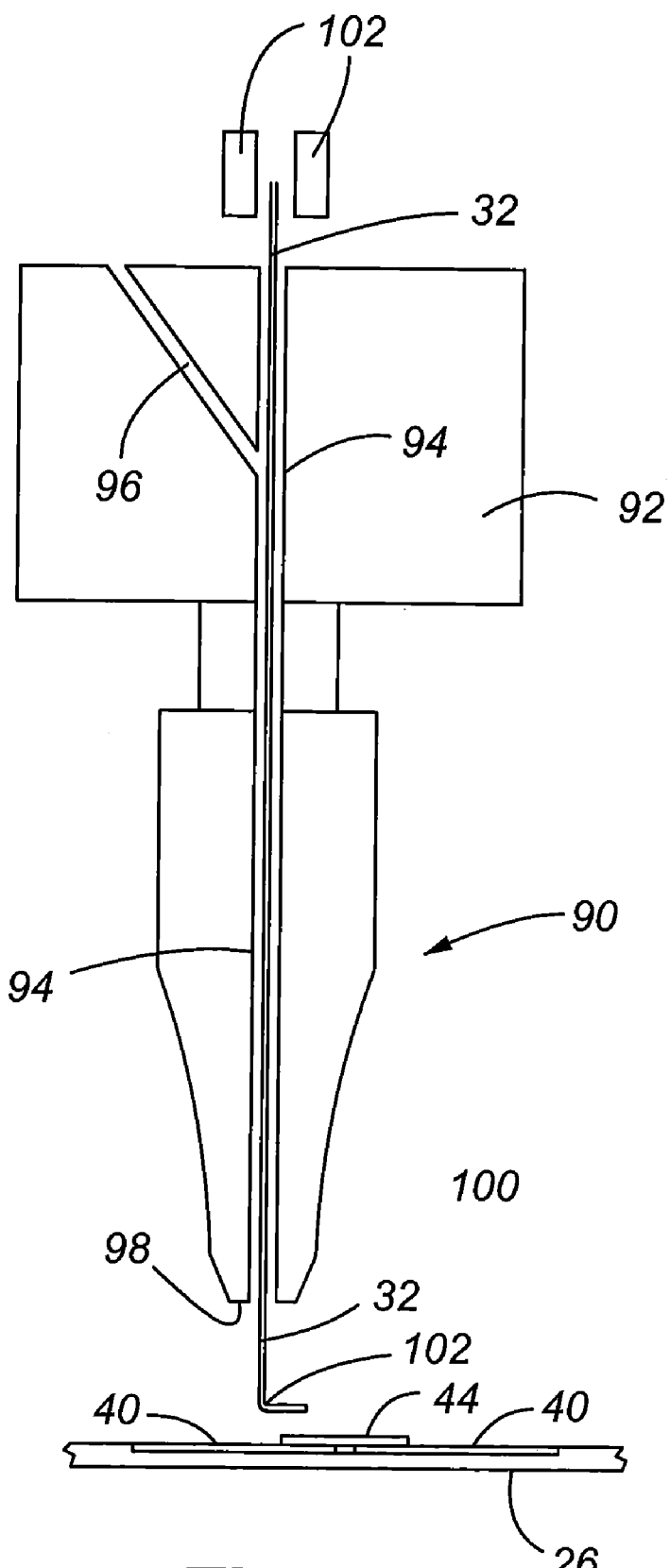
FIG. 21 is a schematic view of the embedding tool in a raised position wherein an additional length of wire is dispensed from the tool compared to that of FIG. 20.

Referring to FIG. 21, the embedding tool is shown in a raised position relative to the substrate. A greater length of residual wire is shown compared to that shown in FIG. 20. The additional length may be created by forcing air through channel 96 to push a length of wire out of the sonotrode.

Alternatively, the wire may be embedded or fixed to the substrate and an additional length of wire drawn from the wire supply by moving the sonotrode.

Figure 22:
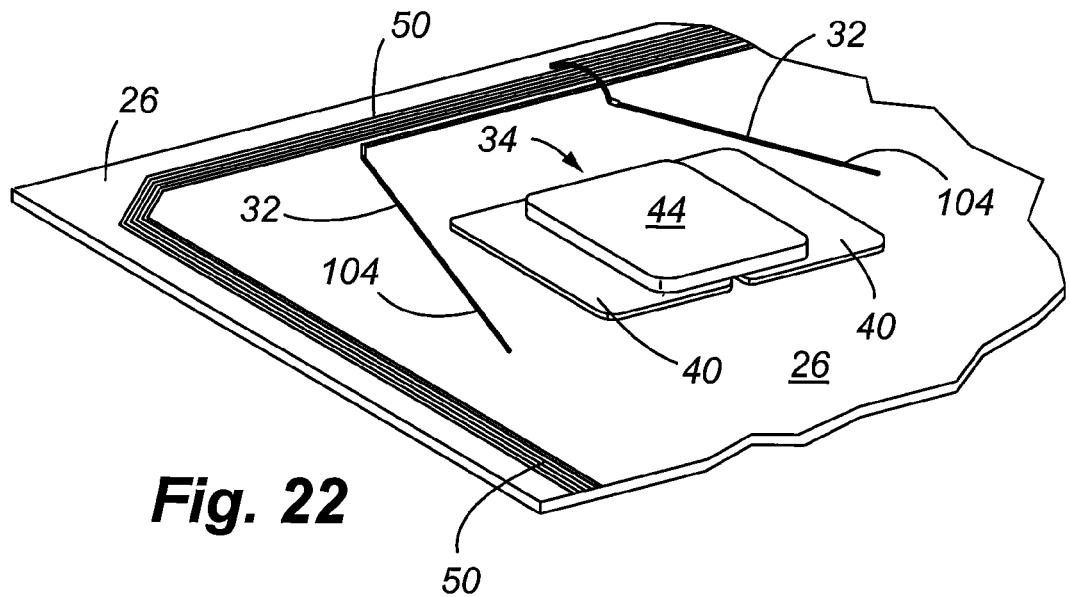
FIG. 22 is an enlarged plan view of a portion of another RF or RFID inlay wherein the opposing ends of the antenna coil placed adjacent the chip module are not formed as loops, but rather are angular extensions, but still being offset or spaced from the terminal areas.

Referring now to FIG. 22, an alternate method is shown for configuring the ends of the antenna coil so that they may be subsequently placed in a position for electrical connection to the terminal areas 40. As shown, the ends of the coil wire 104 are arranged as angular extensions from the embedded coil and they do not contact any part of the chip module 34. Rather, the ends 104 simply lay on the substrate adjacent to the chip module. These angular extensions may be formed by simultaneously moving the ultrasonic head and forcing air through channel 96 to expel wire from the device. Once the length of wire has been arranged on the substrate, the coil 50 is formed. Then another length of the wire is positioned generally as shown to form the second angular extension. It is also alternatively contemplated that the wire ends 104 could have a very small length thereof that is embedded which helps to stabilize the position of the length of wire prior to repositioning and bonding to a terminal area.

Figure 23:
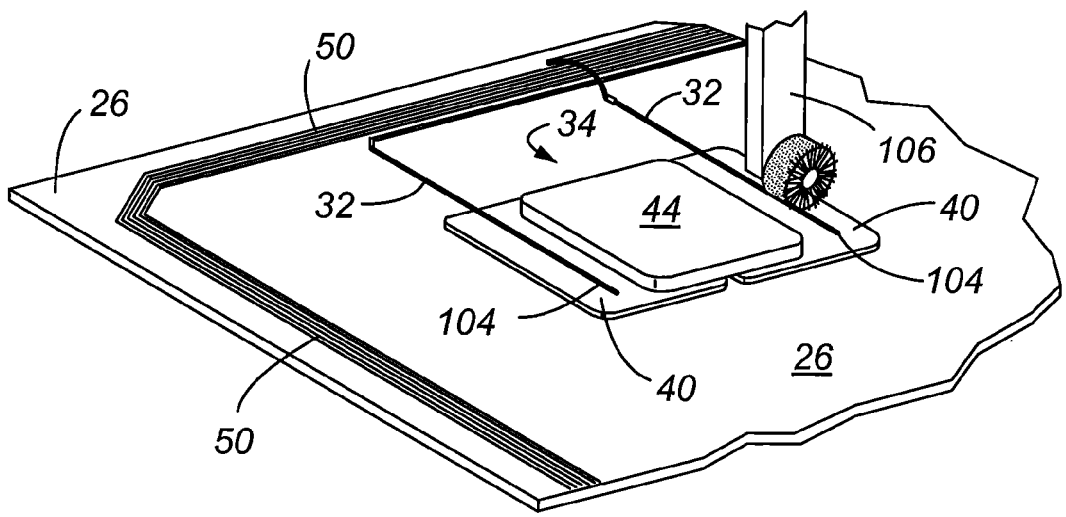
FIG. 23 illustrates the displacement of the angular extensions by brushing or combing them over the terminal areas so that the extensions may then be thermally bonded to the terminal areas.

In the next step of the manufacturing process, the angular extensions are moved into position over the terminal areas as shown in FIG. 23 for interconnection with the terminal areas. If any portion of the wire ends 104 are embedded, the force of the element displacing the wire ends overcomes the embedding force. The angular extensions can be brushed or combed into position, such as by a rotating brush or comb 106. The brush or comb 106 can be another element incorporated in the group of working elements 16. Alternatively, the angular extensions may be gripped and rotated into position. The gripping may be accomplished by a machine or device, or manually by an operator. Once the angular extensions are placed over the terminal areas, the wire ends can be thermally bonded as discussed above. Thus, with the method of manufacture shown in FIGS. 22 and 23, it is not necessary to form loops but rather, just free extending ends that are placed on top of the substrate and then rotated into position for bonding. As discussed above with respect to the removal of insulation from the wire, insulation can also be removed from the angular extensions without damaging the chip module or any other portions of the inlay or transponder device since the angular extensions are spaced from the chip module.

One possible sequence for laying the antenna as shown in the embodiment of FIGS. 22 and 23, comprise the following: first, a length of wire is extended from the embedding head to form a first angular extension. The wire end 104 of the first angular extension may simply lie on the substrate, or a very small length thereof may be embedded in the substrate. The embedding tool then traverses across the substrate in an angular fashion to not lay the wire over any portion of the chip module, but to remain offset from the chip module. The embedding tool travels to the periphery of the substrate and then begins laying the concentric coils to form the antenna. Upon formation of the last coil, the embedding tool travels in an angular orientation to form the second angular extension. Again, the embedding tool does not traverse over any portion of the chip module. In the embodiment shown, the insulated wire is cut at a position so that the angular extensions are approximately the same length, and have approximately the same angular orientation with respect to the opposite sides of the terminal areas. However, it should be appreciated that the angular extension may have different lengths and/or orientations provided the relocation equipment can position the lengths of wire in contact with the terminal areas. A device, such as the brush or comb 106, is then used to displace the angular extensions over the designated portions of the chip module, such as the terminal areas, for electrically connecting the angular extensions to the chip module.

The advantages to the present invention are clear. A manufacturing process is provided for manufacturing RF inlays or transponder devices wherein an improved electrical bond may be achieved between the antenna and terminal areas of the chip module by use of a laser that effectively removes all of the insulation from a designated portion of the wire loops. The creation of the protruding loops spaced from the chip module allows the laser to operate without damaging the chip module or any other portions of the inlay or transponder device. This, in turn, allows use of smaller diameter insulated wire which makes the final RF device less susceptible to physical tampering. The working elements of the processing machine may be integrated in a group such that a single processing machine may be used to fully fabricate the inlay, thereby eliminating the need for additional processing machines or non-cooperating manufacturing components. Alternatively, the processing tools may be separately located or separately co-located in different combinations.

Since the insulation has been removed from the antenna wire prior to bonding of the antenna wire to the terminal areas, the thermal compression bonding head can be operated at a lower voltage, thereby extending the life of the thermal compression bonding head. Additionally, the lower voltage is also compatible with and facilitates the use of smaller diameter wire. The lower voltage can be used to adequately bond the antenna wire to the terminal without completely destroying the wire conductor that could otherwise occur with a head that operates at much higher voltages.

While the foregoing invention has been disclosed with respect to preferred embodiments, it shall be understood that various other changes and modifications can be made to the invention in accordance with the scope of the claims appended hereto.

What is claimed is:

1. A method of manufacturing a radio frequency inlay, comprising:
   placing a chip or chip module on the surface of a substrate or in a recess formed in a substrate, said chip or chip module including a terminal area;
   forming a first loop of wire extending from and above the surface of the substrate, said first loop of wire attached to said substrate at a location on said substrate offset from but not directly over or in contact with said chip or chip module;
   embedding a length of wire partially or completely in said substrate, said length of wire electrically connected to said first loop of wire;
   repositioning said first loop of wire relative to the substrate to which the first loop of wire is attached to a position directly over or in contact with said terminal area;
   electrically connecting said first loop of wire to said terminal area.

2. The method of claim 1, further comprising:
   removing insulation from said first loop of wire prior to electrically connecting said first loop of wire to said terminal area.

3. The method of claim 2, further comprising:
   using a laser to remove said insulation.

4. The method of claim 3, further comprising:
   positioning said laser so that the laser light strikes a portion of said first loop of wire but does not strike said terminal area.

5. The method of claim 1, further comprising:
   forming a second loop of wire extending from and above the surface of the substrate, said second loop of wire formed on said substrate at a location offset from but not directly over or in contact with a second terminal area associated with said chip or chip module.

6. The method of claim 5, further comprising:
repositioning said second loop of wire relative to the substrate to which the second loop of wire is attached to a position directly over or in contact with said second terminal area; and
electrically connecting said second loop of wire to said second terminal area.

7. The method of claim 5, further comprising:
removing insulation from said second loop of wire prior to electrically connecting said second loop of wire to said second terminal area.

8. The method of claim 1, further comprising:
forming said first loop of wire and said length of wire from a continuous length of wire.

9. The method of claim 5, further comprising:
forming said first loop of wire, said second loop of wire and said length of wire from a continuous length of wire.

10. The method of claim 1, wherein repositioning said first loop of wire to a position directly over or in contact with said terminal area comprises engaging said first loop of wire with a movable arm.

11. The method of claim 10, wherein the movable arm comprises a jaw assembly which engages said first loop of wire.

12. The method of claim 11, wherein said jaw assembly comprises at least one notch and the first loop of wire is engaged by said at least one notch.

13. The method of claim 12, wherein said jaw assembly comprises two notches spaced from each other such that the two notches do not contact the chip or chip module when moving said first loop of wire to a position directly over or in contact with said terminal area.

14. The method of claim 11, wherein said jaw assembly contacts said surface of said substrate in moving said first loop of wire to a position directly over or in contact with said terminal area.

15. The method of claim 14, wherein said jaw assembly pivots when engaging or moving said first loop of wire.

16. The method of claim 6, wherein repositioning said first and second loops of wire to a position directly over or in contact with said first and second terminal areas comprises engaging said first and second loops of wire with separate opposed arms and moving said arms towards each other.

17. The method of claim 16, further comprising limiting the movement of the opposed arms with a stop apparatus.

18. The method of claim 1, wherein embedding said length of wire partially or completely in said substrate comprises forming an antenna.

19. The method of claim 5, further comprising electrically connecting said first loop of wire, said second loop of wire and said length of wire.

20. The method of claim 1, further comprising using a tool to move the first loop of wire and holding the tool in place while electrically connecting the first loop of wire to the first terminal area.

21. The method of claim 5, further comprising using a tool to move the second loop of wire and holding the tool in place while electrically connecting the second loop of wire to the second terminal area.

22. The method of claim 5, wherein the step of forming a second loop of wire extending above the surface of the substrate comprises forming said second loop of wire at a location offset from but not directly over or in contact with a second terminal area associated with said chip or chip module.

23. A method of manufacturing a radio frequency inlay, comprising:
providing a single substrate with a location to receive a chip or chip module;
forming a first loop of wire extending from and above the surface of the substrate, said first loop of wire attached to said substrate at a location proximate to the location to receive a chip or chip module;
embedding a length of wire partially or completely in said substrate, said length of wire electrically connected to said first loop of wire;
placing a chip or chip module at the location for receiving a chip or chip module, said chip or chip module including a first terminal area;
repositioning said first loop of wire relative to the substrate to which the first loop of wire is attached to a position directly over or in contact with said terminal area;
electrically connecting said first loop of wire to said terminal area.

24. The method of claim 23, further comprising:
removing insulation from said first loop of wire prior to electrically connecting said first loop of wire to said first terminal area.

25. The method of claim 24, further comprising:
using a laser to remove said insulation.

26. The method of claim 22, wherein the chip or chip module comprises a second terminal area, the method further comprising:
forming a second loop of wire extending above the surface of the substrate, said second loop of wire formed proximate the location to receive the chip or chip module.

27. The method of claim 26, further comprising:
repositioning said second loop of wire to a position directly over or in contact with said second terminal area; and
electrically connecting said second loop of wire to said second terminal area.

28. The method of claim 26, further comprising:
removing insulation from said second loop of wire prior to electrically connecting said second loop of wire to said second terminal area.

29. The method of claim 22, further comprising:
forming said first loop of wire and said length of wire from a continuous length of wire.

30. The method of claim 26, further comprising:
forming said first loop of wire, said second loop of wire and said length of wire from a continuous length of wire.

31. The method of claim 1, wherein the substrate comprises a single layer.

32. The method of claim 22, wherein the substrate comprises a single layer.

33. The method of claim 23 wherein the location to receive a chip or chip module is a recess formed in the substrate.

* * * * *

UNITED STATES PATENT AND TRADEMARK OFFICE
CERTIFICATE OF CORRECTION

| | | |
|---|---|---|
| PATENT NO. | : 8,286,332 B2 | Page 1 of 1 |
| APPLICATION NO. | : 11/860210 | |
| DATED | : October 16, 2012 | |
| INVENTOR(S) | : Lang et al. | |

It is certified that error appears in the above-identified patent and that said Letters Patent is hereby corrected as shown below:

At column 16, line 32, Claim 26 should read:
    26. The method of claim 23, wherein the chip or chip . . .

At column 16, line 47, Claim 29 should read:
    29. The method of claim 23, further comprising: . . .

At column 16, line 55, Claim 32 should read:
    32. The method of claim 23, wherein the substrate com- . . .

Signed and Sealed this
Nineteenth Day of March, 2013

Teresa Stanek Rea
*Acting Director of the United States Patent and Trademark Office*